US012660653B2

(12) United States Patent
Jin et al.

(10) Patent No.: US 12,660,653 B2
(45) Date of Patent: Jun. 16, 2026

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Sang Hyun Jin, Incheon (KR); Young Jin Kang, Gwangju (KR); Jin Suk Jeong, Incheon (KR); Yun Kyung Jeong, Incheon (KR); Hyun Goo Cha, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 566 days.

(21) Appl. No.: 18/086,185

(22) Filed: Dec. 21, 2022

(65) Prior Publication Data

US 2023/0121621 A1     Apr. 20, 2023

Related U.S. Application Data

(63) Continuation-in-part of application No. 17/329,721, filed on May 25, 2021, now Pat. No. 11,876,040.

(51) Int. Cl.
| | |
|---|---|
| *H01L 23/498* | (2006.01) |
| *H01L 23/31* | (2006.01) |
| *H10W 70/05* | (2026.01) |
| *H10W 70/65* | (2026.01) |
| *H10W 70/685* | (2026.01) |

(Continued)

(52) U.S. Cl.
CPC ........... *H10W 70/65* (2026.01); *H10W 70/05* (2026.01); *H10W 70/093* (2026.01); *H10W*

*70/685* (2026.01); *H10W 74/016* (2026.01); *H10W 74/117* (2026.01)

(58) Field of Classification Search
CPC ......... H01L 23/49838; H01L 23/49822; H01L 23/528–5283; H01L 23/5383; H01L 23/5386
See application file for complete search history.

(56) References Cited

U.S. PATENT DOCUMENTS

| | | |
|---|---|---|
| 6,713,381 B2 | 3/2004 | Barr et al. |
| 6,930,256 B1 | 8/2005 | Huemoeller et al. |

(Continued)

OTHER PUBLICATIONS

Office Action for Taiwan Application No. 111119534 mailed Feb. 5, 2026.

*Primary Examiner* — Evan G Clinton
(74) *Attorney, Agent, or Firm* — Spectrum IP Law Group LLC

(57) ABSTRACT

In one example, an electronic device comprises a substrate having a top side and a bottom side, an electronic component over the top side of the substrate, and an encapsulant over the top side of the substrate. The substrate comprises a dielectric structure comprising a first dielectric layer and a conductive structure in the dielectric structure and comprising a first conductor tier in the first dielectric layer comprising a first trace exposed from a top side of the first dielectric layer and partially extending through the first dielectric layer and a first via exposed from the top side of the first dielectric layer and a bottom side of the first dielectric layer and extending from the top side of the first dielectric layer to the bottom side of the first dielectric layer. The first trace and the first via have non-stepped sidewalls extending vertically. Other examples are also disclosed herein.

13 Claims, 37 Drawing Sheets

(51) Int. Cl.
  *H10W 74/01* (2026.01)
  *H10W 74/10* (2026.01)

(56) References Cited

U.S. PATENT DOCUMENTS

| | | |
|---|---|---|
| 11,024,577 B1 | 6/2021 | Park et al. |
| 2009/0085172 A1 | 4/2009 | Horigome et al. |
| 2010/0078820 A1 | 4/2010 | Kurokawa et al. |
| 2010/0081271 A1 | 4/2010 | Ishizaka et al. |
| 2010/0136781 A1 | 6/2010 | Kulkarni et al. |
| 2012/0155055 A1 | 6/2012 | Kang et al. |
| 2012/0322261 A1 | 12/2012 | Shue et al. |
| 2015/0249038 A1 | 9/2015 | Xu et al. |
| 2015/0270166 A1 | 9/2015 | Matsumoto et al. |
| 2016/0268199 A1 | 9/2016 | Lee et al. |
| 2017/0229358 A1 | 8/2017 | Cooney, III et al. |
| 2020/0043908 A1 | 2/2020 | Chung et al. |
| 2021/0057303 A1 | 2/2021 | Chen et al. |
| 2022/0037202 A1 | 2/2022 | Lin et al. |
| 2022/0077078 A1 | 3/2022 | Jeong et al. |
| 2022/0393105 A1 | 12/2022 | Leng |
| 2023/0021192 A1 | 1/2023 | Leng |
| 2023/0307294 A1 | 9/2023 | Ma |
| 2023/0345735 A1 | 10/2023 | Leng |

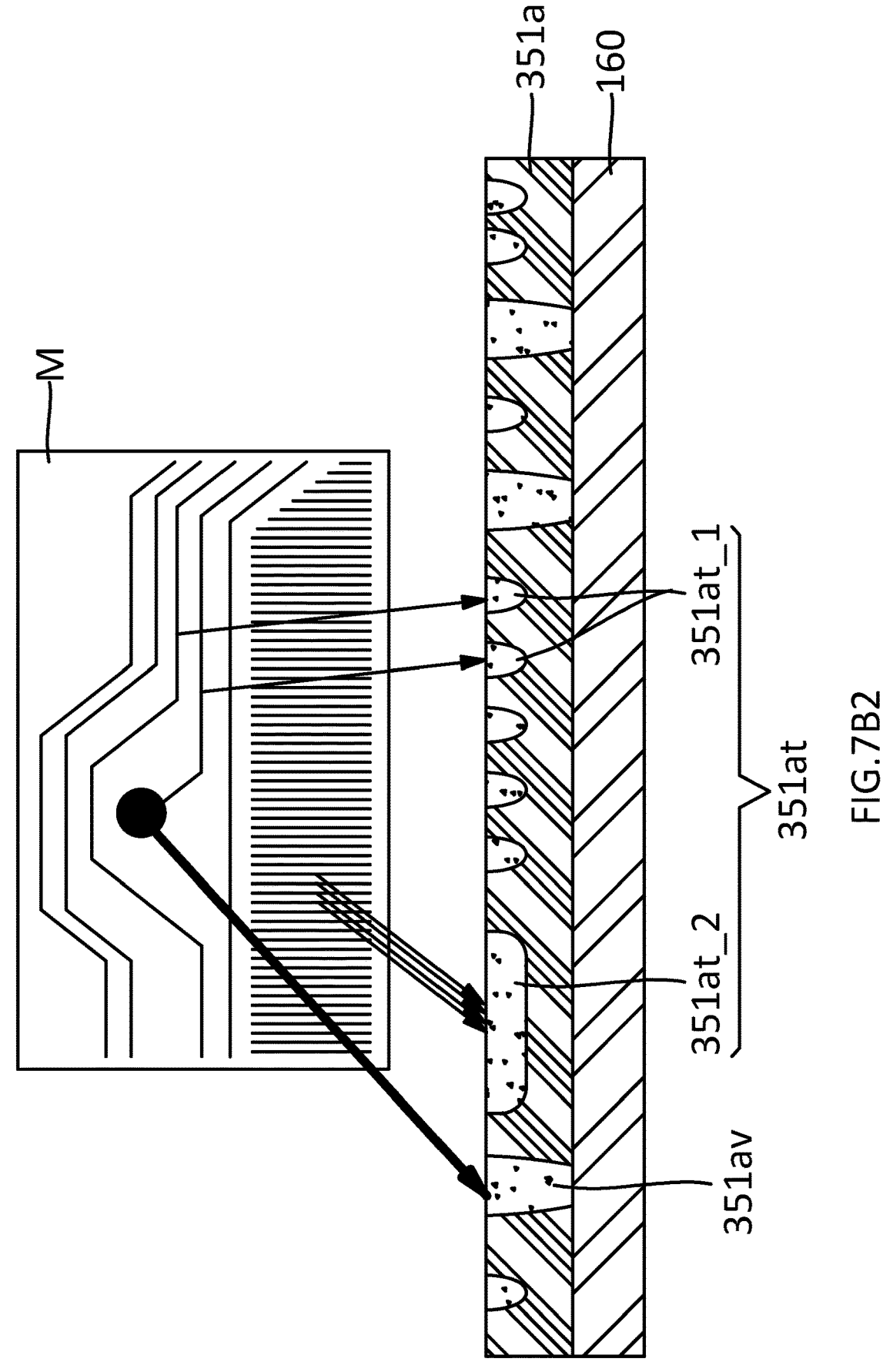
FIG.7B2

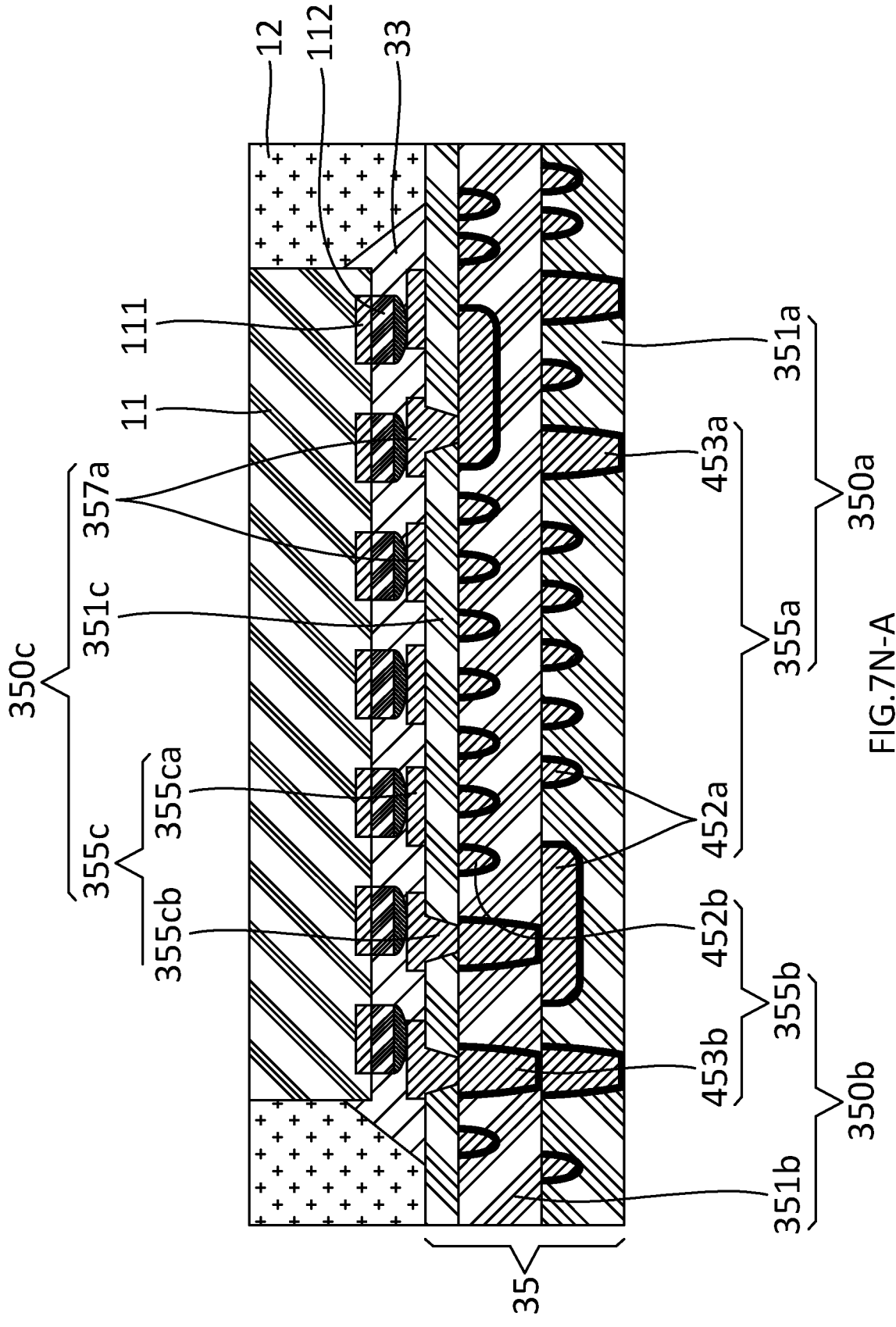
FIG.7N-A

SEMICONDUCTOR DEVICES AND METHODS OF MANUFACTURING SEMICONDUCTOR DEVICES

CROSS-REFERENCE TO RELATED APPLICATIONS

The present application is a continuation-in-part of U.S. application Ser. No. 17/329,721 filed May 25, 2021. Said application Ser. No. 17/329,721 is hereby incorporated herein by reference in its entirety.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
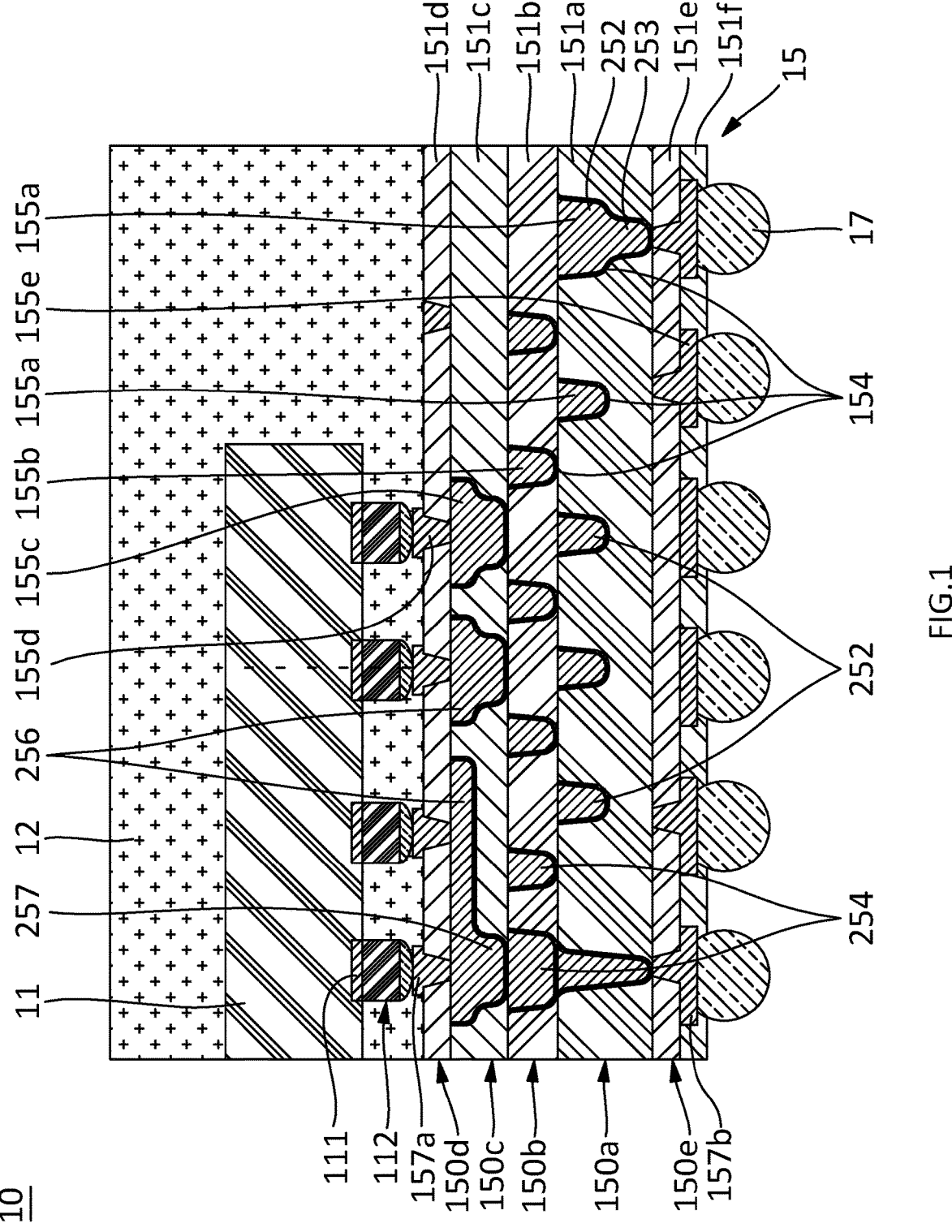
FIG. 1 shows a cross-sectional view of an electronic device according to an example.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, an electronic device comprises a substrate comprises a first dielectric having a top surface and a bottom surface, and a first conductor in the first dielectric and comprising a first via and a first trace over the first via. The first trace comprises a first trace sidewall and a first trace base, and the first via comprises a first via sidewall. The first conductor comprises a first arcuate vertex between the first trace sidewall and the first trace base, and a second arcuate vertex between the first via sidewall and the first trace base, an electronic component over the top surface of the substrate, and an encapsulant over the top surface of the substrate and contacting a lateral side of the electronic component.

In another example, a method to manufacture an electronic device comprises providing a first dielectric having a top surface and a bottom surface, providing a first trace pattern in the first dielectric from the top surface, wherein the first trace pattern defines a first trace comprising a first trace base, a first trace sidewall, and a first arcuate vertex between the first trace base and the first trace sidewall, providing a first via pattern in the first dielectric, wherein the first via pattern defines a first via comprising a first via sidewall and a second arcuate vertex between the first trace base and the first via sidewall, removing a portion of the first dielectric at the first trace pattern and the first via pattern to expose a first via opening or first via openings and a first trace opening or first trace openings in the first dielectric, and providing a first conductive material in the first via opening and the first trace opening to provide a first conductor comprising the first trace and the first via.

In yet another example, a method to manufacture an electronic device comprises providing a first dielectric having a top surface and a bottom surface, and a first conductor in the first dielectric comprising a first via and a first trace over the first via, providing an electronic component over the top surface of the first dielectric, and providing an encapsulant over the top surface of the first dielectric and contacting a lateral side of the electronic component. The first trace comprises a first trace sidewall and a first trace base, and the first via comprises a first via sidewall, and the first conductor comprises a first arcuate vertex between the first trace sidewall and the first trace base, and a second arcuate vertex between the first via sidewall and the first trace base.

In an additional example, an electronic device comprises a substrate having a top side and a bottom side, an electronic component over the top side of the substrate, and an encapsulant over the top side of the substrate and contacting a lateral side of the electronic component. The substrate comprises a dielectric structure comprising a first dielectric layer and a conductive structure in the dielectric structure and comprising a first conductor tier in the first dielectric layer. The first conductor tier comprises a first trace exposed from a top side of the first dielectric layer and partially extending through the first dielectric layer, and a first via exposed from the top side of the first dielectric layer and a bottom side of the first dielectric layer and extending from the top side of the first dielectric layer to the bottom side of the first dielectric layer. The conductive structure is coupled with the electronic component and the first trace and the first via have non-stepped sidewalls extending vertically.

In another additional example, a method to manufacture an electronic device comprises providing a first dielectric layer, providing a first mask over the first dielectric layer, wherein the first mask has a first broad slit, and a first group of narrow slits, and applying light to the first dielectric layer through the first mask. A first via pattern is defined in the first dielectric layer through the first broad slit, and a first trace pattern is defined in the first dielectric layer through the first group of narrow slits. The method further comprises removing portions of the first dielectric layer at the first via pattern and at the first trace pattern to define a first via opening and a first trace opening, providing a first conductor on the first dielectric layer including in the first via opening and in the first trace opening, and removing an upper portion of the first conductor to define a first via and a first trace in the first dielectric layer.

In yet another additional example, a method to manufacture an electronic device comprises providing a substrate having a top side and a bottom side, providing an electronic component over the top side of the substrate, and providing an encapsulant over the top side of the substrate and contacting a lateral side of the electronic component. Providing the substrate comprises providing a dielectric structure comprising a first dielectric layer and providing a conductive structure in the dielectric structure. The conductive structure comprises a first conductor tier in the first dielectric layer, and the first conductor tier comprises a first trace exposed from a top side of the first dielectric layer and partially extending through the first dielectric layer, and a first via exposed from the top side of the first dielectric layer and a bottom side of the first dielectric layer and extending from the top side of the first dielectric layer to the bottom side of the first dielectric layer. The method further comprises coupling the conductive structure with the electronic component, wherein the first trace and the first via have non-stepped sidewalls extending vertically.

Other examples are included in the present disclosure. Such examples may be found in the figures, in the claims, and/or in the description of the present disclosure.

FIG. 1 shows cross-sectional view of an electronic device. In the example of FIG. 1, electronic device 10 can include electronic component 11, substrate 15, encapsulant 12, and connectors 17.

Electronic component 11 can comprise terminals 111 coupled to interconnects 112. Substrate 15 can comprise conductive structure 155 having conductors 155a, 155b, 155c, 155d, or 155e comprising one or more conductive layers or patterns that define conductive paths, traces, vias, internal terminals 157a, or external terminals 157b. Substrate 15 can comprise dielectric structure 151 comprising one or more dielectric layers defining dielectrics 151a, 151b, 151c, 151d, 151e, or 151f for providing structural integrity, separation, or insulation for conductive structure 155. In some examples, conductor 155a can be in dielectric layer 151a and can comprise via 253 and trace 252 over via 253. Substrate 15 can comprise one or more of the dielectric layers defining a top surface and a bottom surface with electronic component 11 over the top surface of substrate 15. Encapsulant 12 can be over the top surface of substrate 15 and can contact a lateral side of electronic component 12. Connectors 17 can be considered part of substrate 15, but can be optional in some implementations. Substrate 15 or connectors 17 can facilitate connection of electronic component 11 to an external device, such as a printed circuit board or another electronic or semiconductor component. Substrate 15, encapsulant 12, and connectors 17 can protect electronic component 11 from external factors and/or environmental exposure. In some examples, substrate 15 can be provided as a complete or nearly complete component or structure by first providing or manufacturing the elements of substrate 15. Electronic device 10 can then be manufactured by providing electronic component 11 and encapsulant 12 over the top surface of substrate 15, with encapsulant contacting a lateral side of electronic component 11.

In some examples, dielectric layer 151b can be over dielectric layer 151a. One or more traces 254 can be in dielectric layer 151b and can be offset from one or more traces 252 of dielectric layer 151a, for example in an offset pattern or arrangement, or an interleave pattern or arrangement. Multiple traces can be in the same dielectric layer, for example traces 252 can be in dielectric layer 151a, traces 254 can be in dielectric layer 151b, traces 256 can be in dielectric layer 151c, and so on. In some examples, a first trace 252 in dielectric layer 151a can be over via 253, and a second trace 252 in dielectric layer 151a can be offset from the first trace 252. A top side of the second trace 252 can be exposed from the top surface of dielectric layer 151a, and dielectric layer 151A can cover a base, for example base 151-t2 discussed below, of the second trace 252. In some examples, a trace 252 in dielectric layer 151b can be exposed from a top surface of dielectric layer 151b and can contact a top surface of dielectric layer 151b.

In some examples, trace 254 can be in dielectric layer 151b and via 253 can be in dielectric layer 151a wherein trace 254 contacts via 253, for example as shown on the left-hand side of substrate 15 in FIG. 1. In some examples, dielectric layer 151c can be over dielectric layer 151a and can comprise conductor 155c comprising via 257 and trace 256 over via 257 having the same or similar sidewalls, vertices, or bases as trace 252 and via 253 of dielectric layer 151a as described herein.

Figures 2A, 2B:
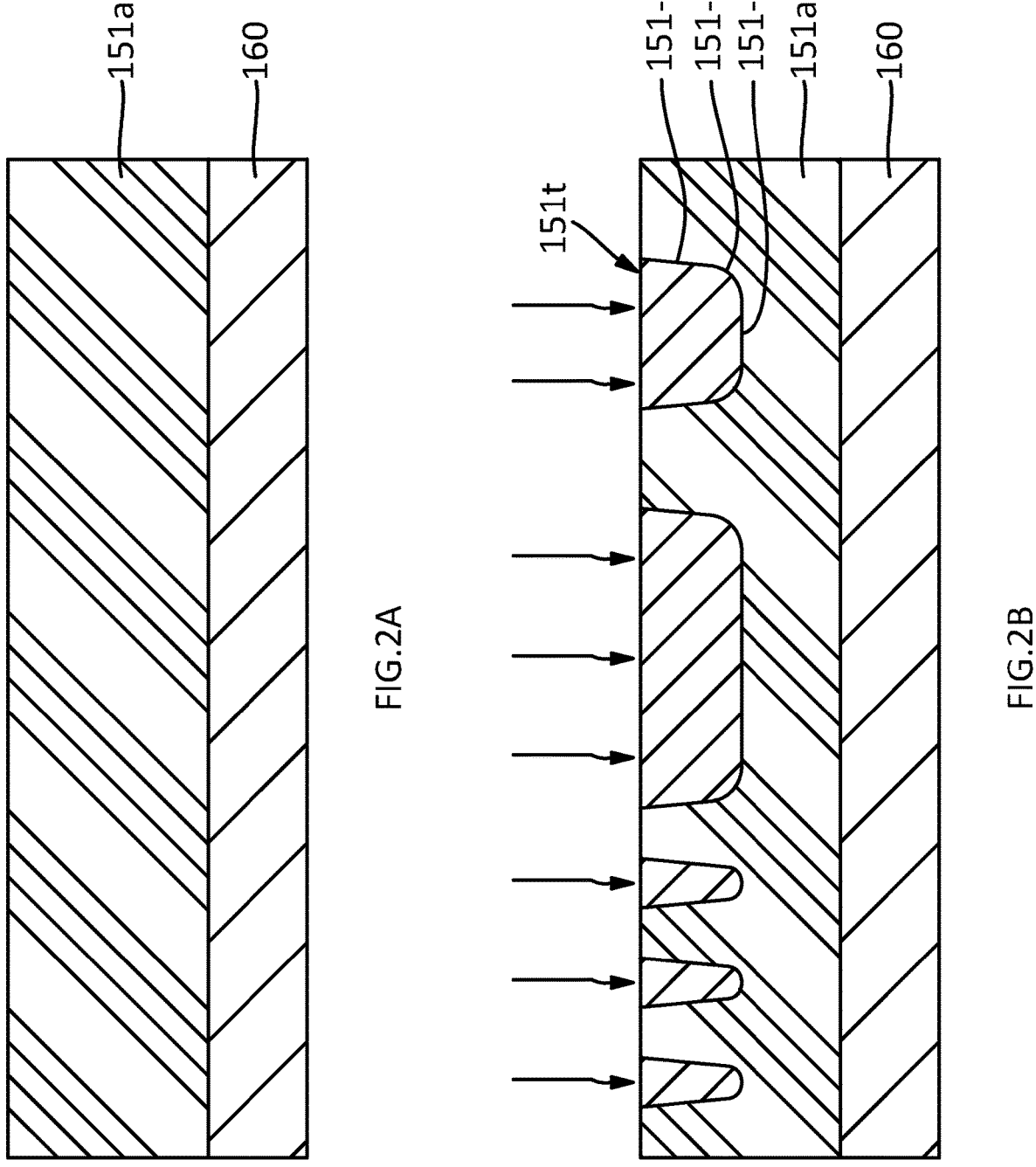
FIGS. 2A to 2D show cross-sectional views of a dual damascene process for manufacturing the electronic device.

FIGS. 2A to 2D show cross-sectional views of a process for manufacturing the electronic device. FIG. 2A shows an initial stage of the manufacturing process.

In FIG. 2A, dielectric 151a can be provided on carrier 160. Carrier 160 can be a substantially planar plate. For example, carrier 160 can comprise or be referred to as a board, a wafer, a panel, a semiconductor, or a strip. In some examples, carrier 160 can comprise steel, stainless steel, aluminum, copper, ceramic, glass, or a wafer. Carrier 160 can have a thickness in a range from about 1 mm to about 3 mm and a width in a range from about 200 mm to about 450 mm.

Carrier 160 can function to handle concurrent formation of multiple electronic components 11. Carrier 160 can be commonly applied to some examples of this disclosure.

A top side and a bottom side of dielectric 151a can be substantially planar. In some examples, dielectric 151a can include phenolic resin, epoxy resin, glass epoxy, polyimide (PI), polyester, benzocyclobutene (BCB), poly benzoxazole (PBO), bismaleimide triazine (BT), silicone, an oxide layer ($SiO_2$), or a nitride layer ($Si_3N_4$). In some examples, dielectric 151a can have a photosensitive property.

Dielectric 151a can have a thickness capable of accommodating a trace and a via for providing a pattern. For example, dielectric 151a can have a thickness in a range from about 1 μm to about 50 μm. For example, dielectric 151a can be provided by a spin coating method or a spray coating method.

FIG. 2B shows a later stage of the manufacturing process. In the example of FIG. 2B, a trace pattern 151t can be provided on dielectric 151a. The trace pattern 151t can comprise a redistribution layer (RDL) pattern. A mask defining trace pattern 151t can be aligned over dielectric 151a and then irradiated with ultraviolet (UV) rays (UV light). The trace pattern 151t can be transferred by the mask onto dielectric 151a. In some examples, trace pattern 151t can have a thickness of about 20% to about 80% of a total thickness of dielectric 151a. For example, trace pattern 151t can have a thickness in a range from about 0.2 μm to about 40 μm. In some examples, the irradiation or development process of trace pattern 151t can produce sidewalls 151-t1 with curvature or slope, and vertex 151-t3 that is arcuate, rather than square or straight-line cornered, between sidewall 151-t1 and base 151-t2.

Figures 2C, 2D:
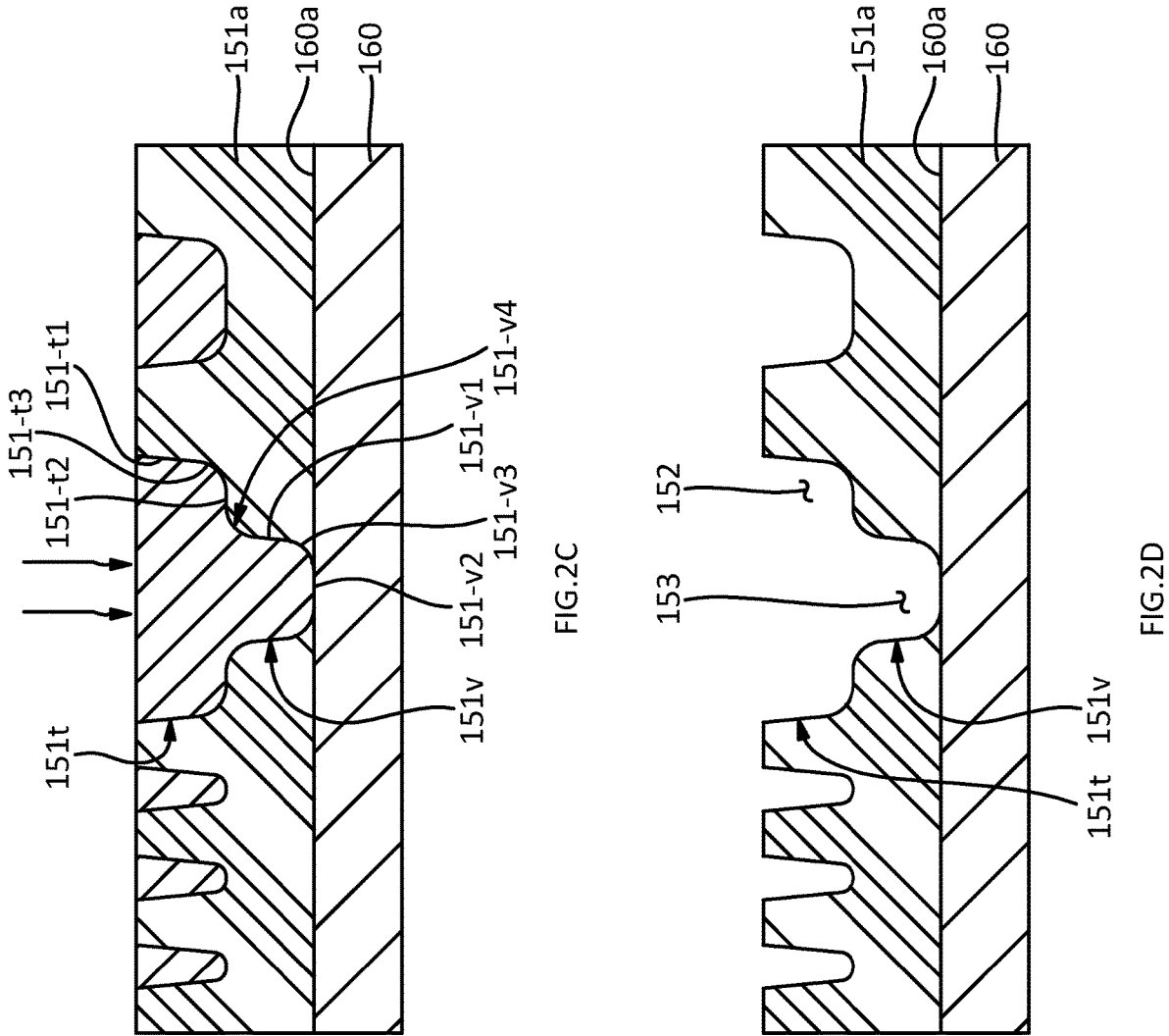

FIG. 2C shows a later stage of the manufacturing process. In the example of FIG. 2C, via pattern 151v can be provided on dielectric 151a. A mask defining via pattern 151v can be aligned over dielectric 151a and then irradiated with ultraviolet rays. The via pattern 151v can be transferred the mask onto dielectric 151a.

In some examples, via pattern 151v can have a thickness of about 20% to about 80% of a total thickness of dielectric 151a. For example, via pattern 151v can have a thickness in a range from about 0.2 μm to about 40 μm. In some examples, the irradiation or development process of via pattern 151v can produce sidewalls 151-v1 with curvature or slope, can produce vertex 151-v3 that is arcuate, between sidewall 151-v1 and base 151-v2, and can produce vertex 151-v4 that is arcuate, between via pattern 151v and trace pattern 151t. There can be examples where vertex 151-v3 can be square. Trace pattern 151t can merge with via pattern 151v, such that vertex 151-v4 merges sidewall 151-v1 of via pattern 151v with base 151-t2 or vertex 151-t3 of trace pattern 151t. In some examples sloped sidewalls 151t1 or 151v1, or arcuate vertex 151-t3, 151-v3, or 151-v4, can dissipate or diminish stress points that could otherwise form at junctions of flatter surfaces, or at square vertices of a trace or via, diminishing the probability of failure by stress cracking.

Ultraviolet rays for defining via pattern 151v can have an intensity greater than the ultraviolet rays for providing trace pattern 151t. For example, when the ultraviolet rays for exposing trace pattern 151t has an intensity of about 10, the ultraviolet rays for exposing the via pattern 151v has an intensity of about 20 or more, e.g., the intensity of the rays defining via pattern 151v can be double or more than the intensity for developing trace pattern 151t. Thus, via pattern 151v on dielectric 151a can be defined at a portion deeper than a depth where trace pattern 151t is defined. In some examples, via pattern 151v can be defined from a bottom side of trace pattern 151t to top side 160a of carrier 160. In some examples, the stages of FIGS. 2B and 2C can be concurrent, such as where the intensity of the rays defining trace pattern 151t and via pattern 151v are different.

FIG. 2D shows a later stage of the manufacturing process. In the example of FIG. 2D, the unnecessary portion of dielectric 151a removed, such as by development and curing. For example, trace opening 152 and via opening 153 can be defined by removing respective portions of dielectric 151a for trace pattern 151t and via pattern 151v using a developing solution. Trace opening 152 and via opening 153 can communicate or merge with each other. Via opening 153 can have a width less than that of trace opening 152.

After trace opening 152 and via opening 153 are provided, conductor 155a (FIG. 1) comprising a conductive material can be provided in trace opening 152 and via opening 153 to provide via 253 and trace 252 over via 253 (FIG. 1) having forms defined by trace opening 152 and via opening 153 in dielectric layer 151a. As a result, trace 252 can comprise trace sidewall 151-t1 and trace base 151-t2, and via 253 can comprise via sidewall 151-v1 and via base 151-v2. In some examples, conductor 155a can comprise an arcuate vertex 151-t3 between trace sidewall 151-t1 and trace base 151-t2, and another arcuate vertex 151-v4 between via sidewall 151-v1 and trace base 151-t2. In some examples, conductor 155a can comprise arcuate vertex 151-v3 between via base 151-v2 and via sidewall 151-v1. There can be examples where vertex 151-v3 can be square. In some examples, both trace 252 and via 253 can be in a single layer of dielectric material comprising dielectric layer 151a, for example as shown in FIG. 1. In some examples, trace 252 and via 253 can comprise a monolithic structure, for example as shown in FIG. 1. In some examples trace 252 can be exposed from a top surface of dielectric layer 151a, and via 253 can be exposed from a bottom surface of dielectric layer 151a.

The process described can permit simplification of manufacture for trace and via patterns. For example, in a regular dual-damascene process, a dielectric layer is first provided, then a via pattern then provided, then another dielectric layer is provided, and then a traced pattern is provided. As described for the present process in FIG. 2 however, the number of process steps can be reduced, and a process speed can increase. Both of the trace pattern 151t and the via pattern 151v are defined in dielectric 151a, without having to provide a second dielectric. In some examples, the process of FIG. 2 can be referred as a dual damascene process or a double exposure process. Also, a substrate manufactured by applying this process can be referred to as a double-exposure substrate or a dual-damascene substrate.

Figures 3A, 3B:
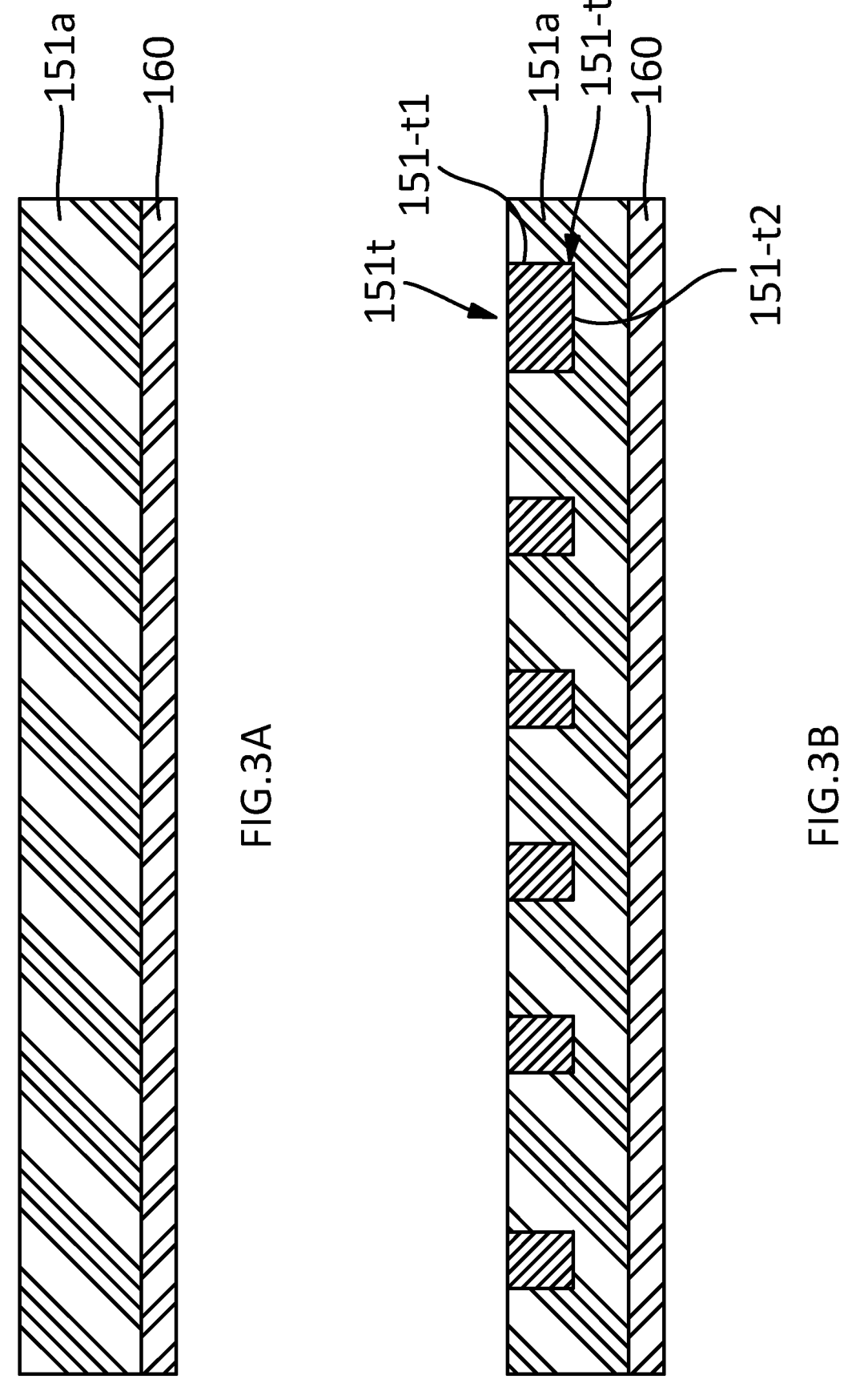
FIGS. 3A to 3X show cross-sectional views for manufacturing the electronic device according to the example in FIG. 1.
Figures 3C, 3D:
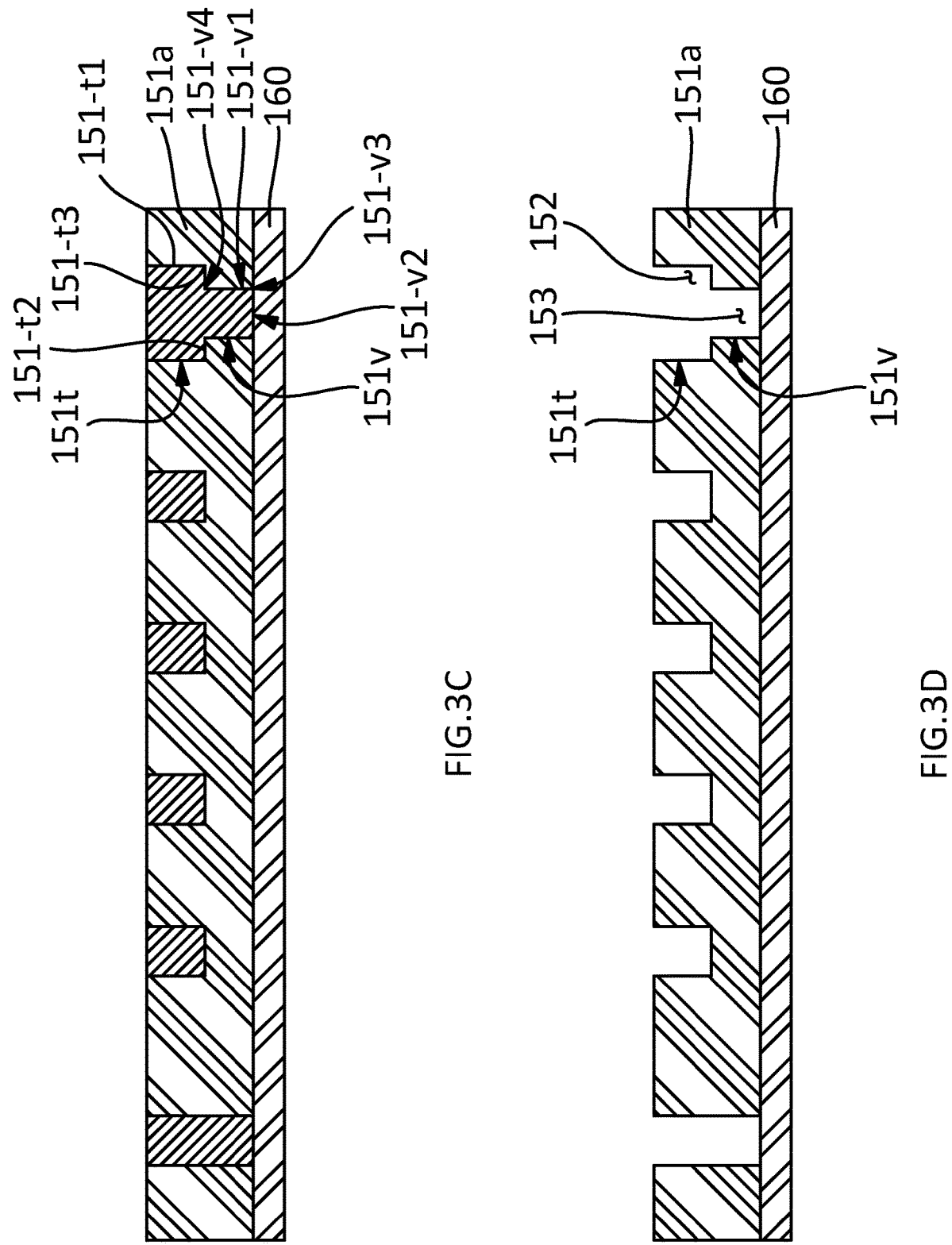
Figures 3E, 3F:
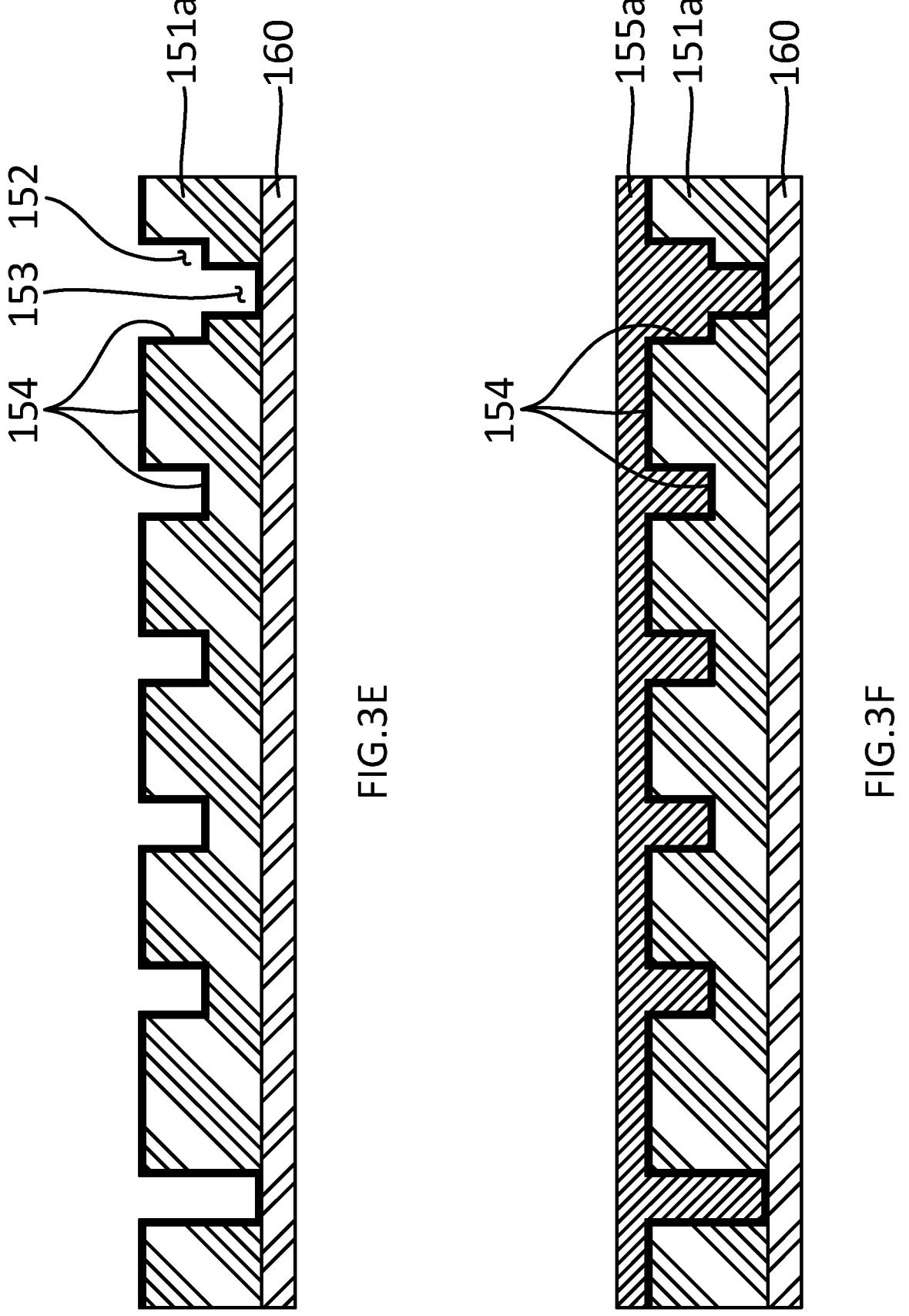
Figures 3G, 3H:
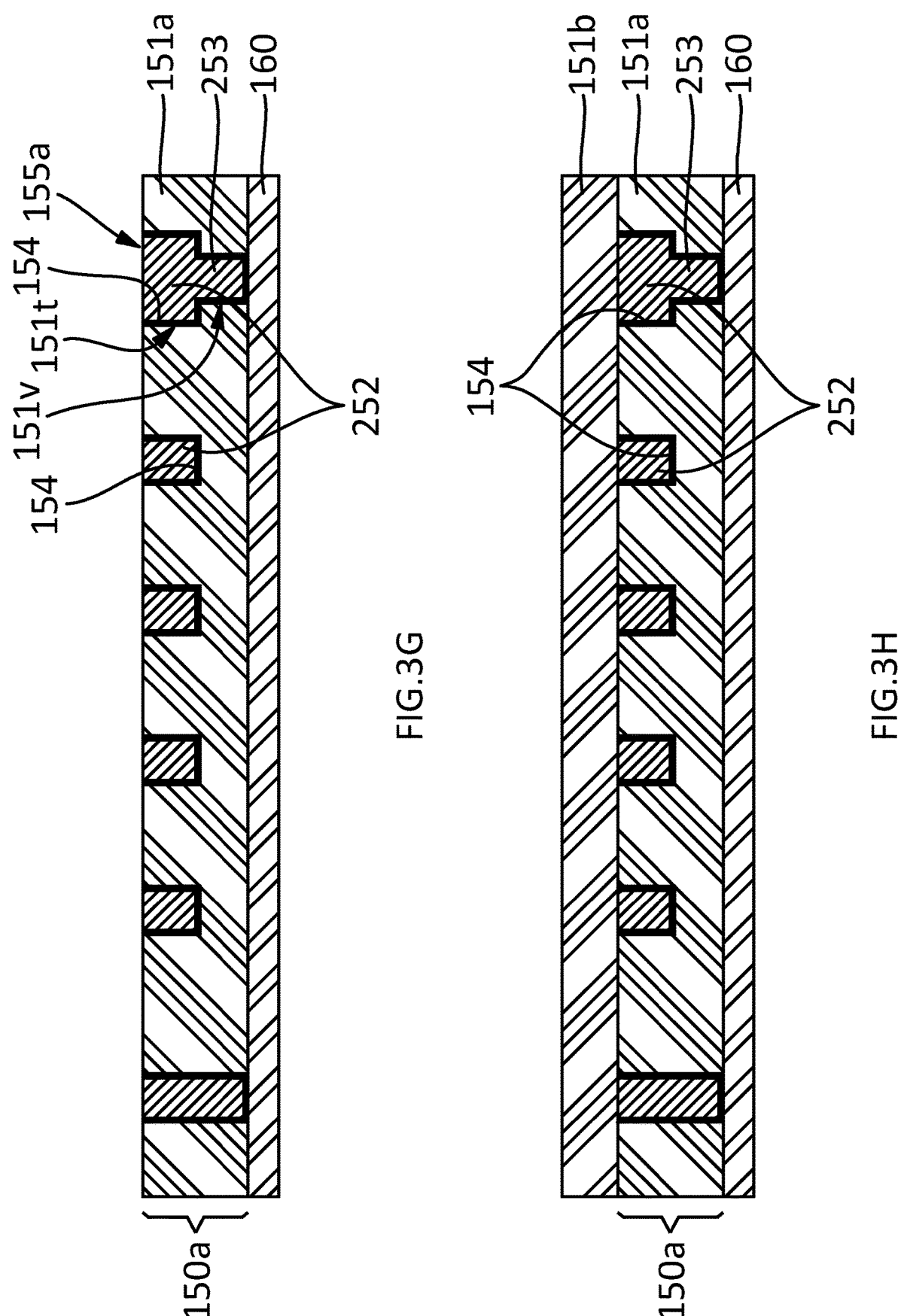
Figures 3I, 3J:
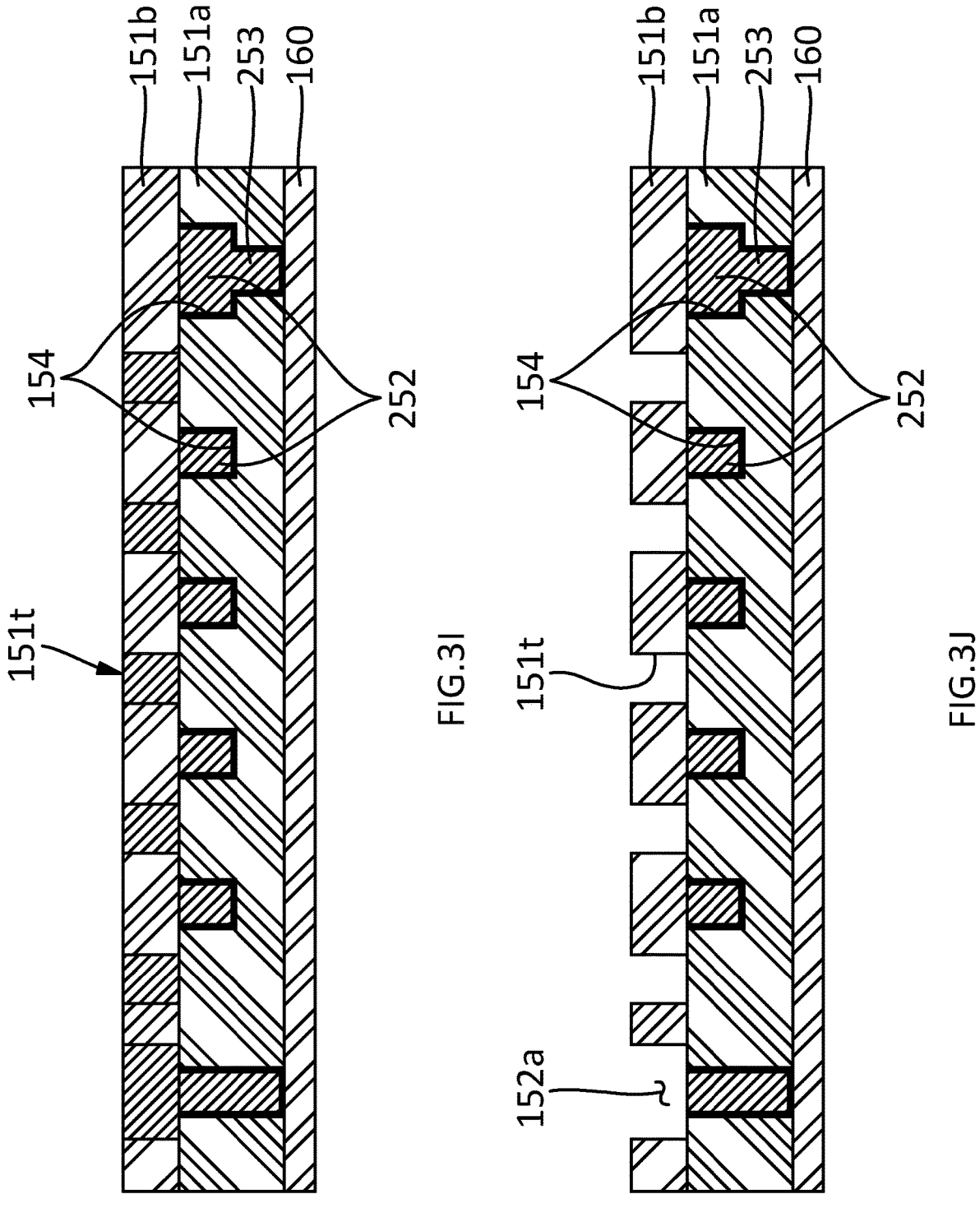
Figures 3K, 3L:
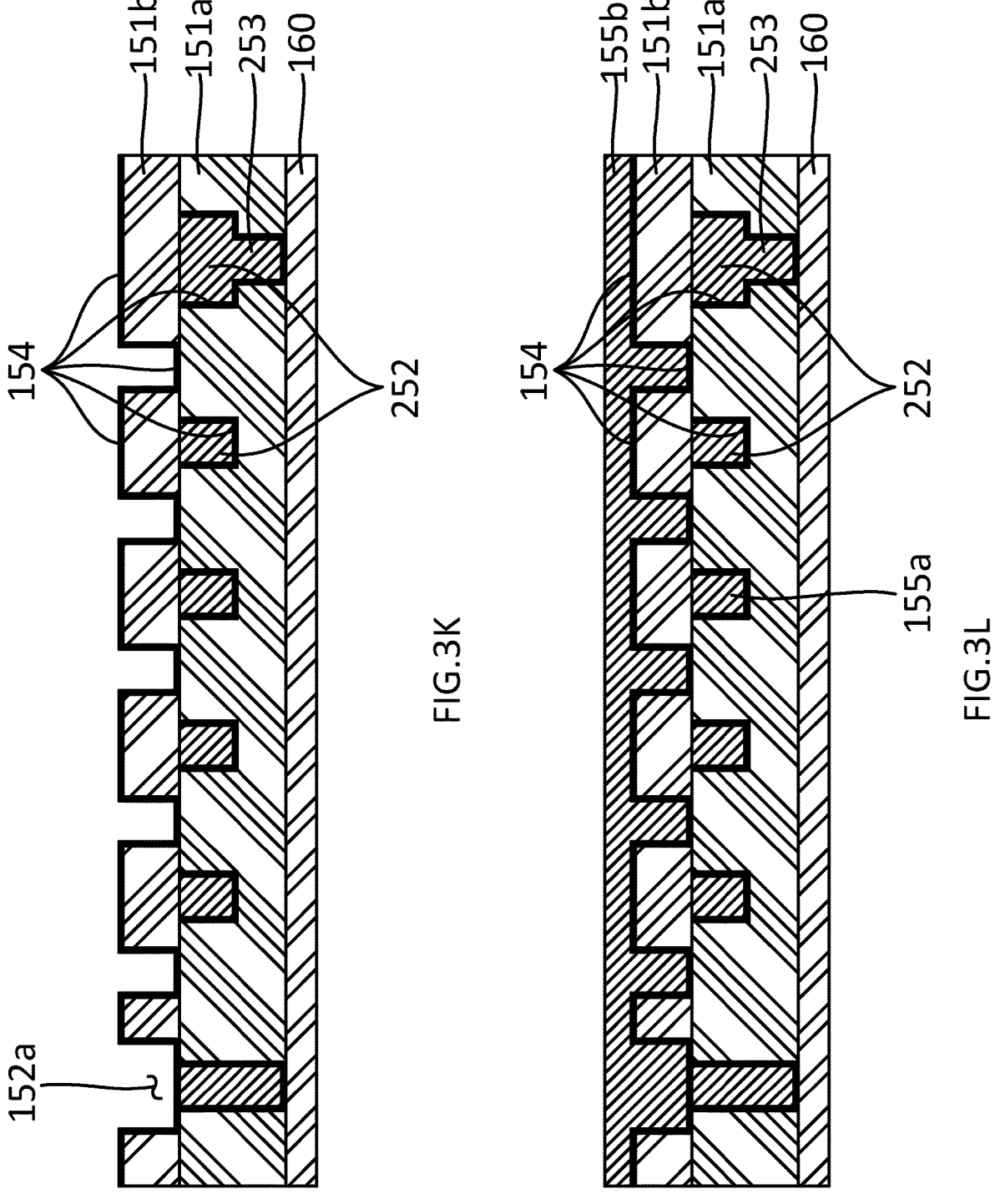
Figures 3M, 3N:
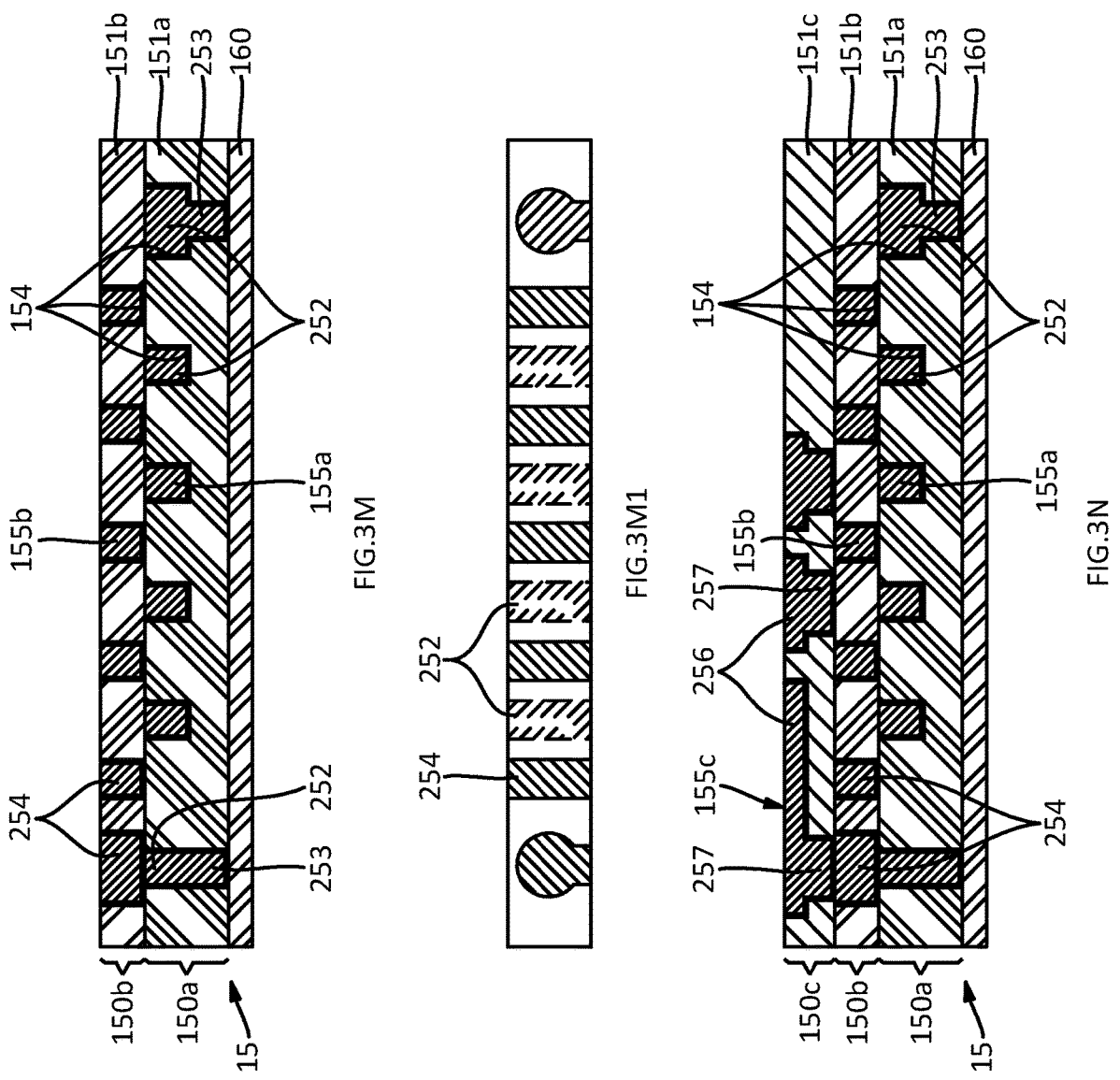
Figures 3O, 3P:
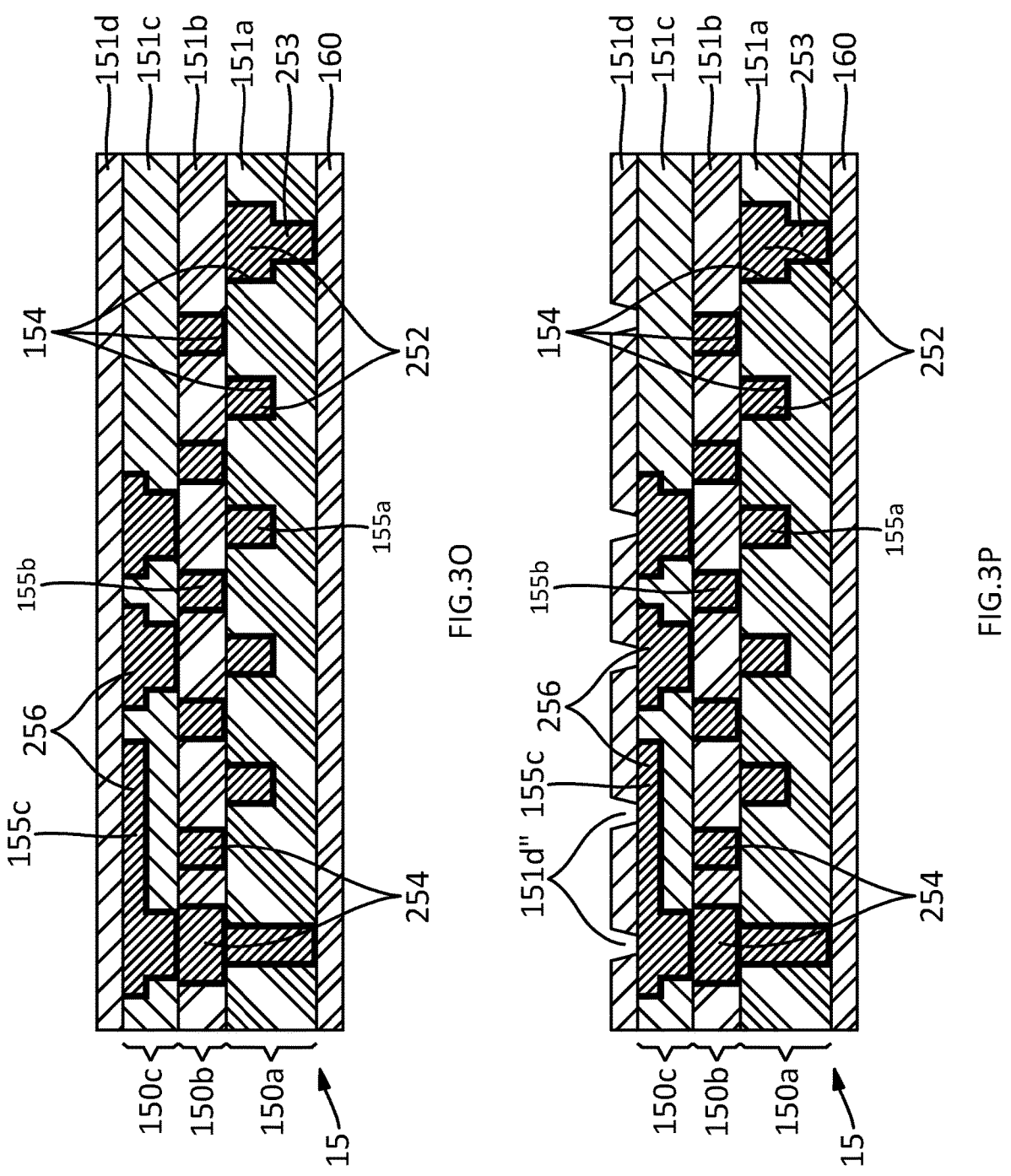
Figures 3Q, 3R:
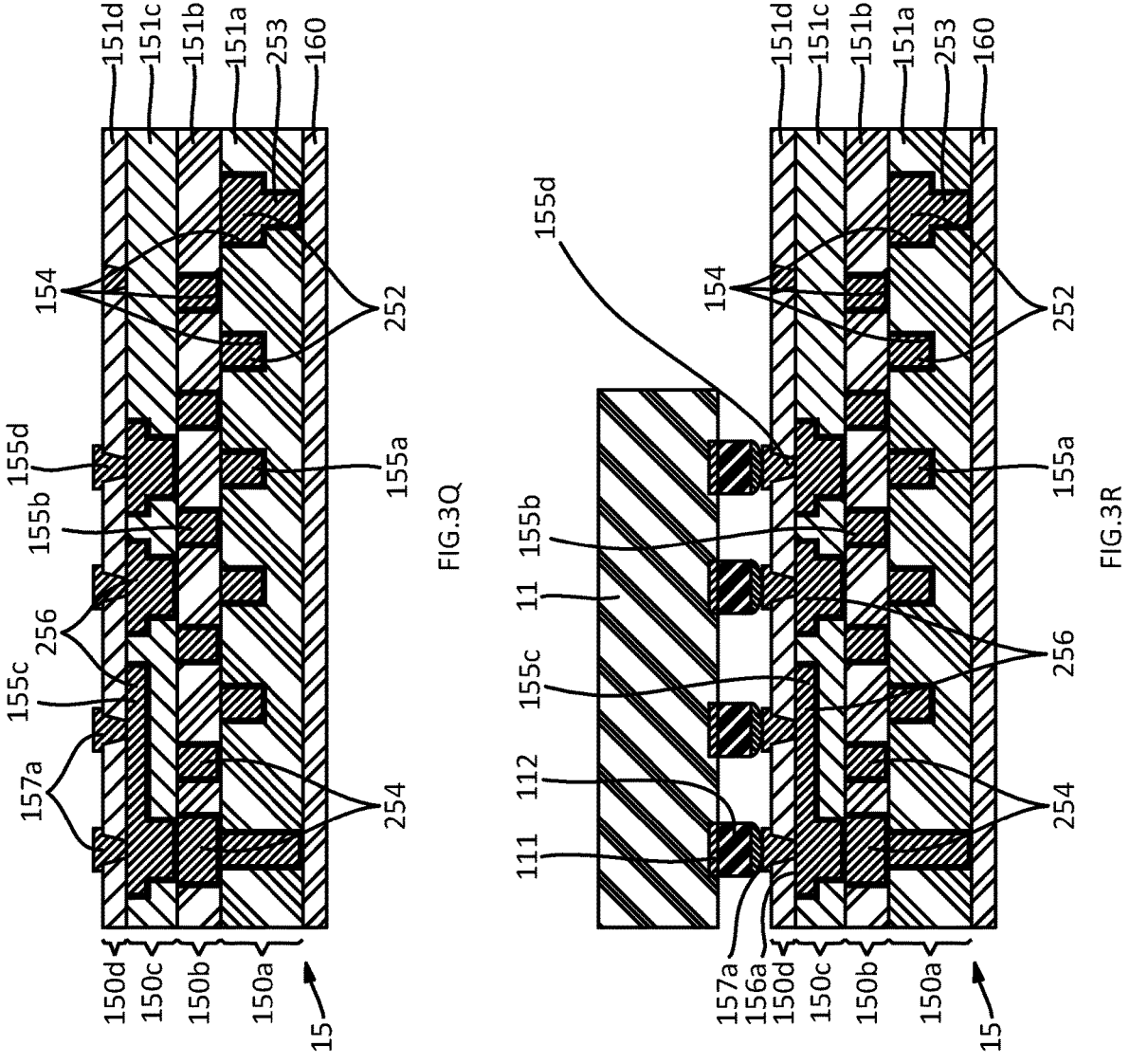
Figure 3S:
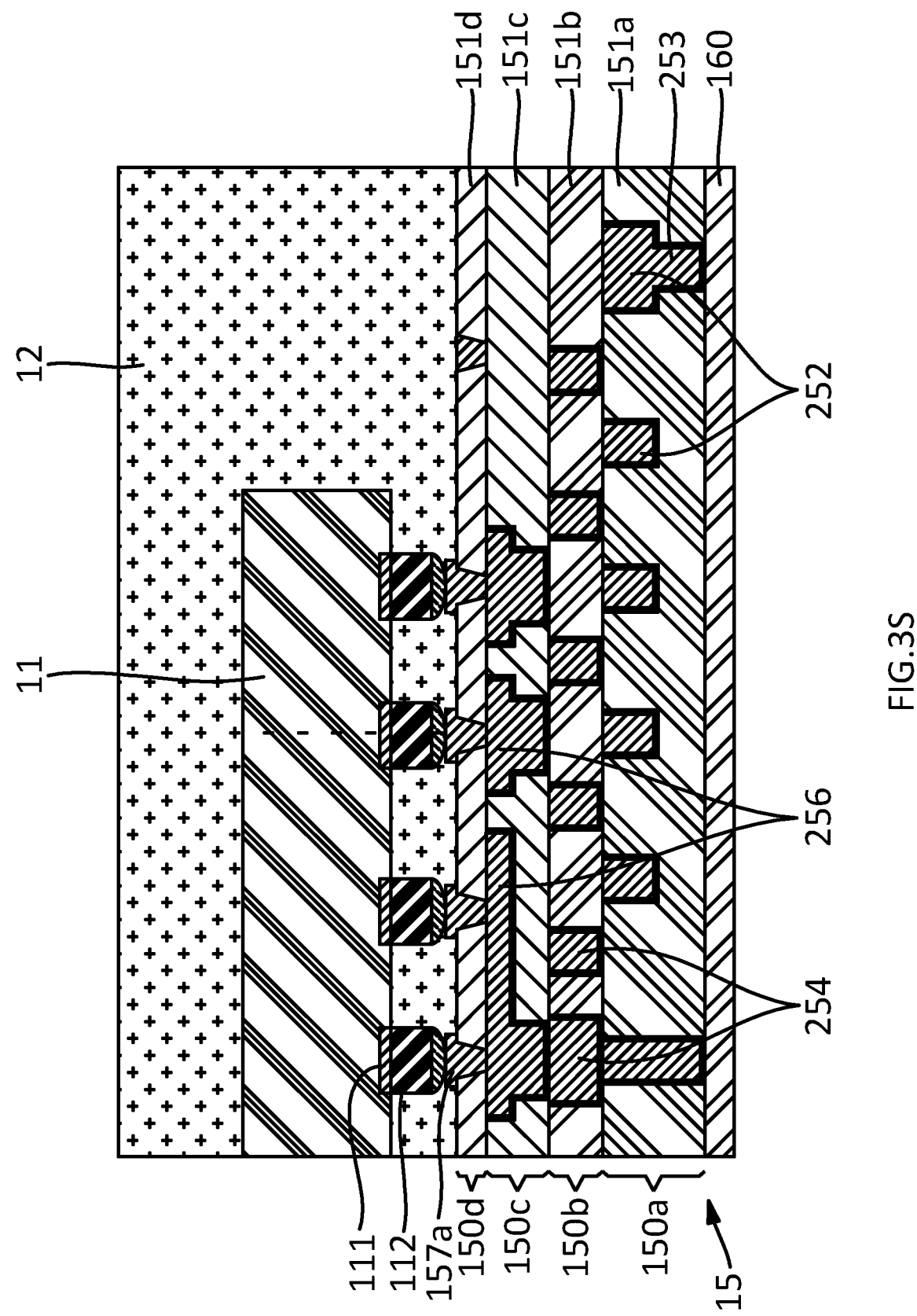
Figure 3T:
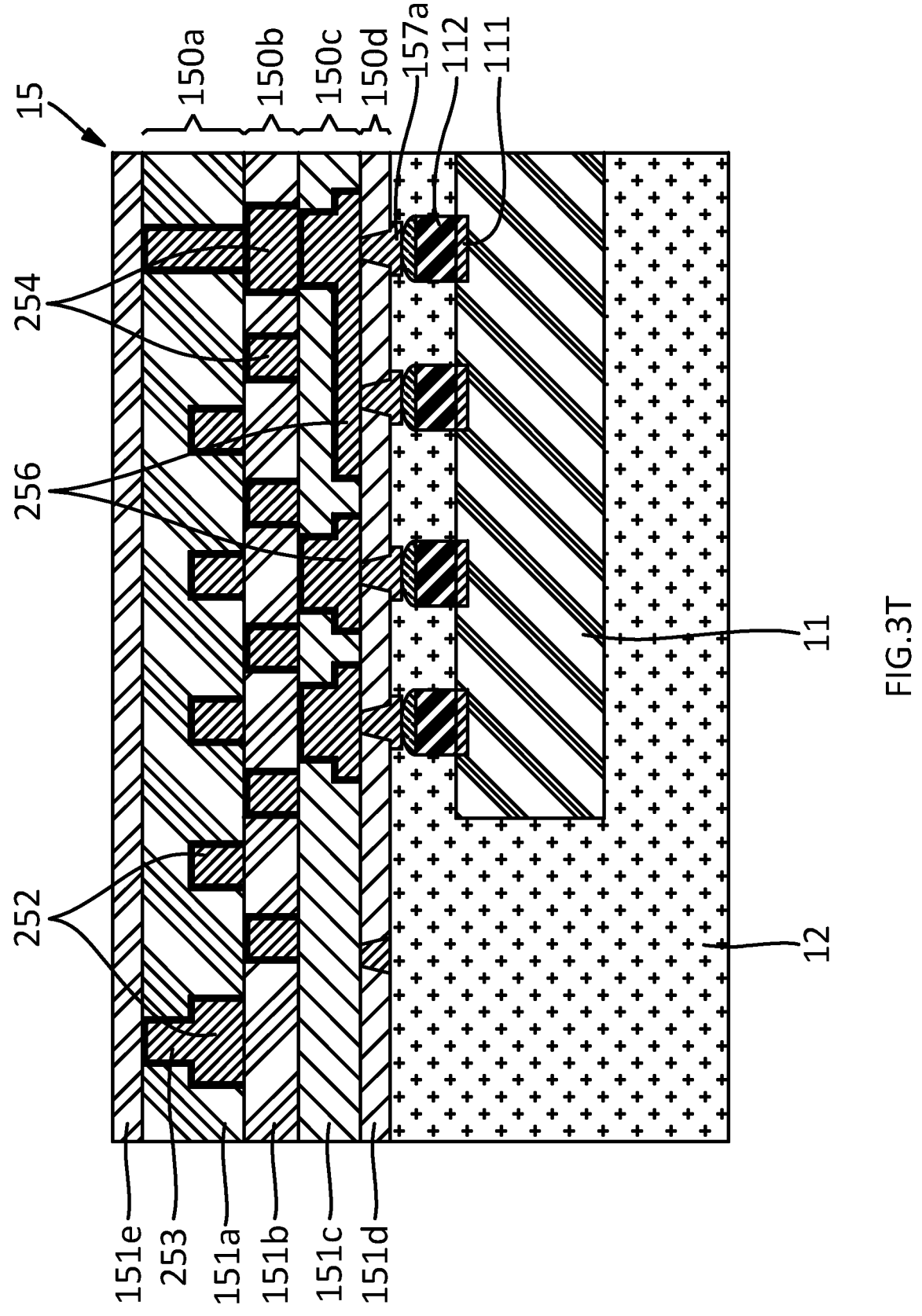
Figure 3U:
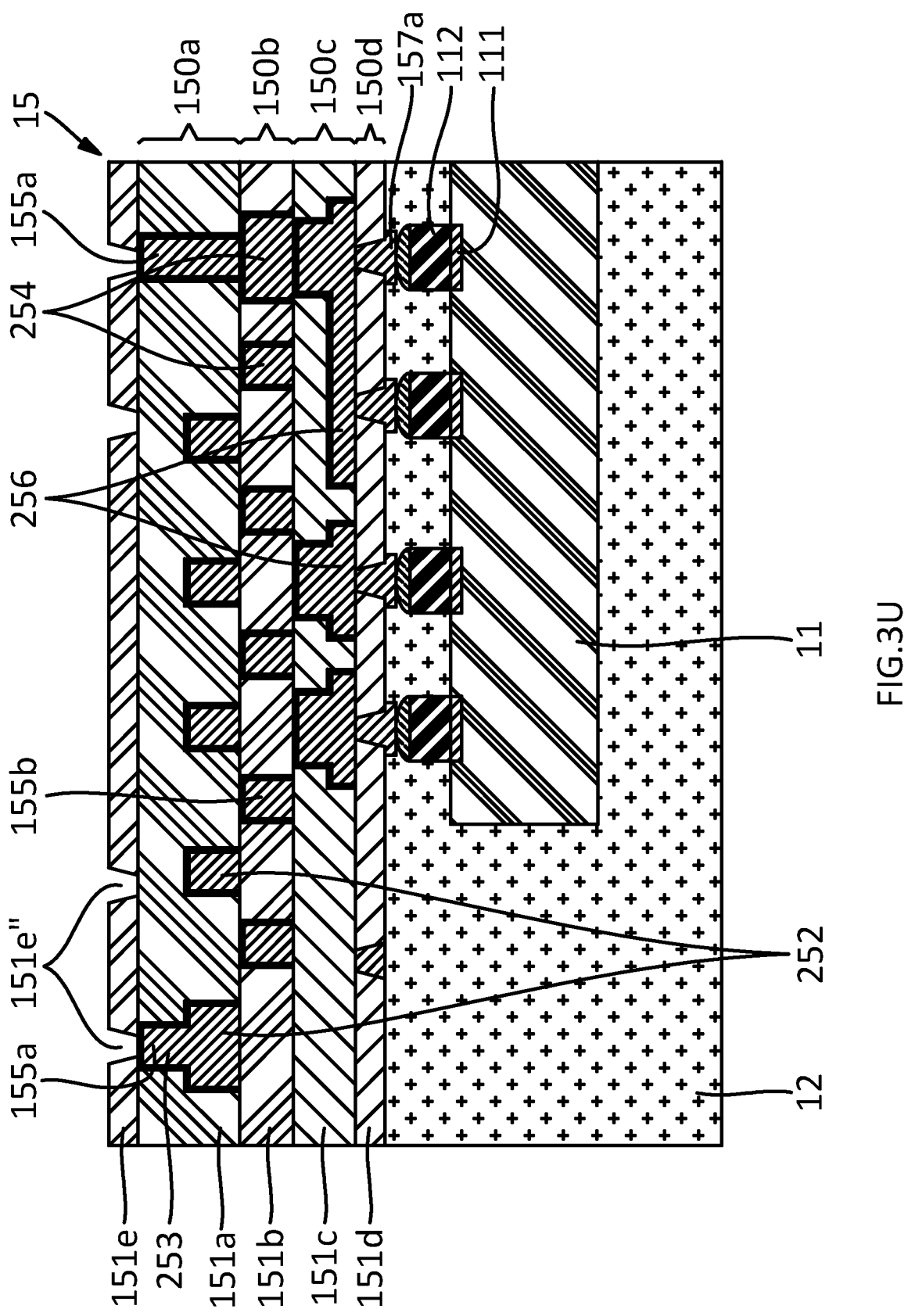
Figure 3V:
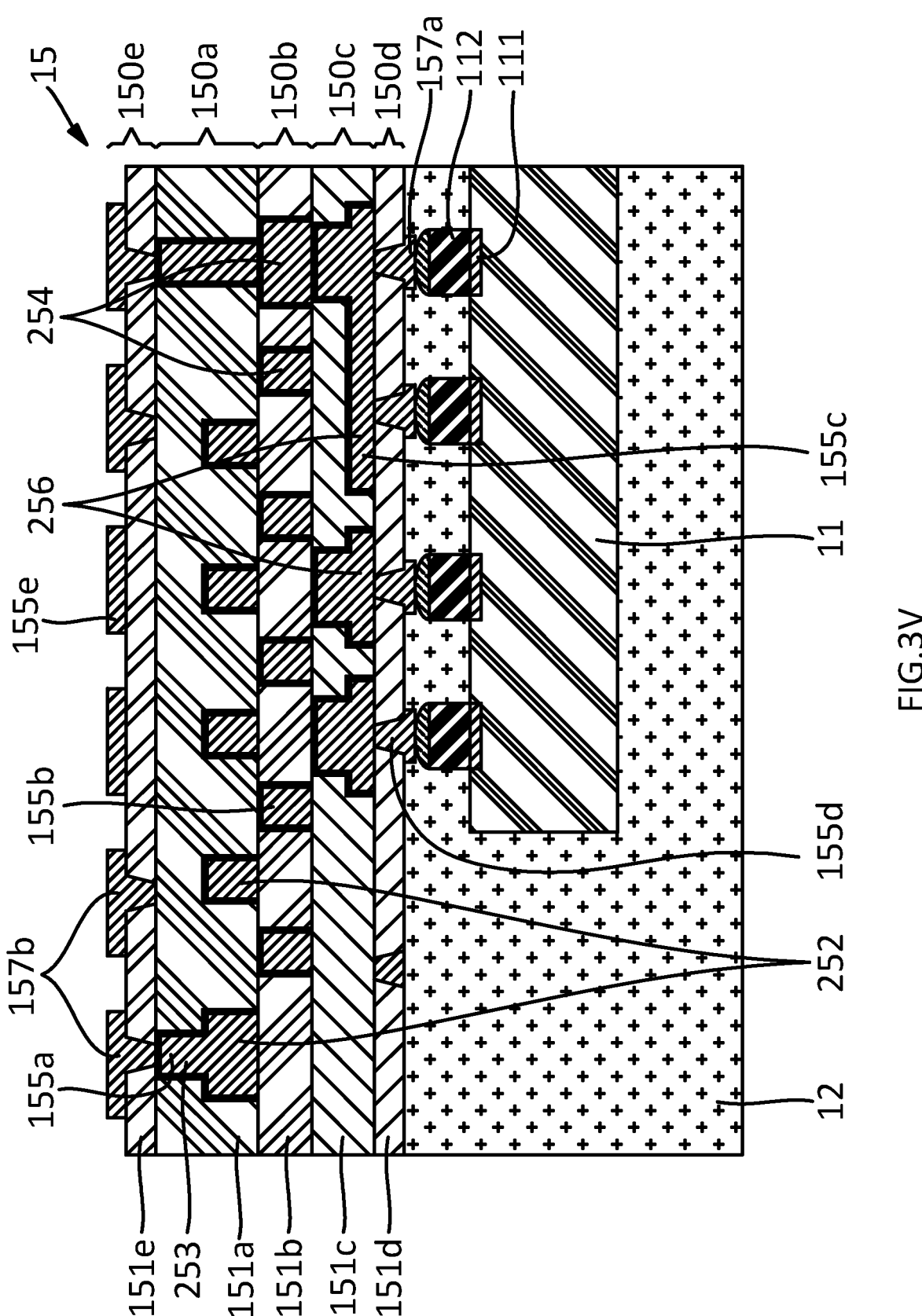
Figure 3W:
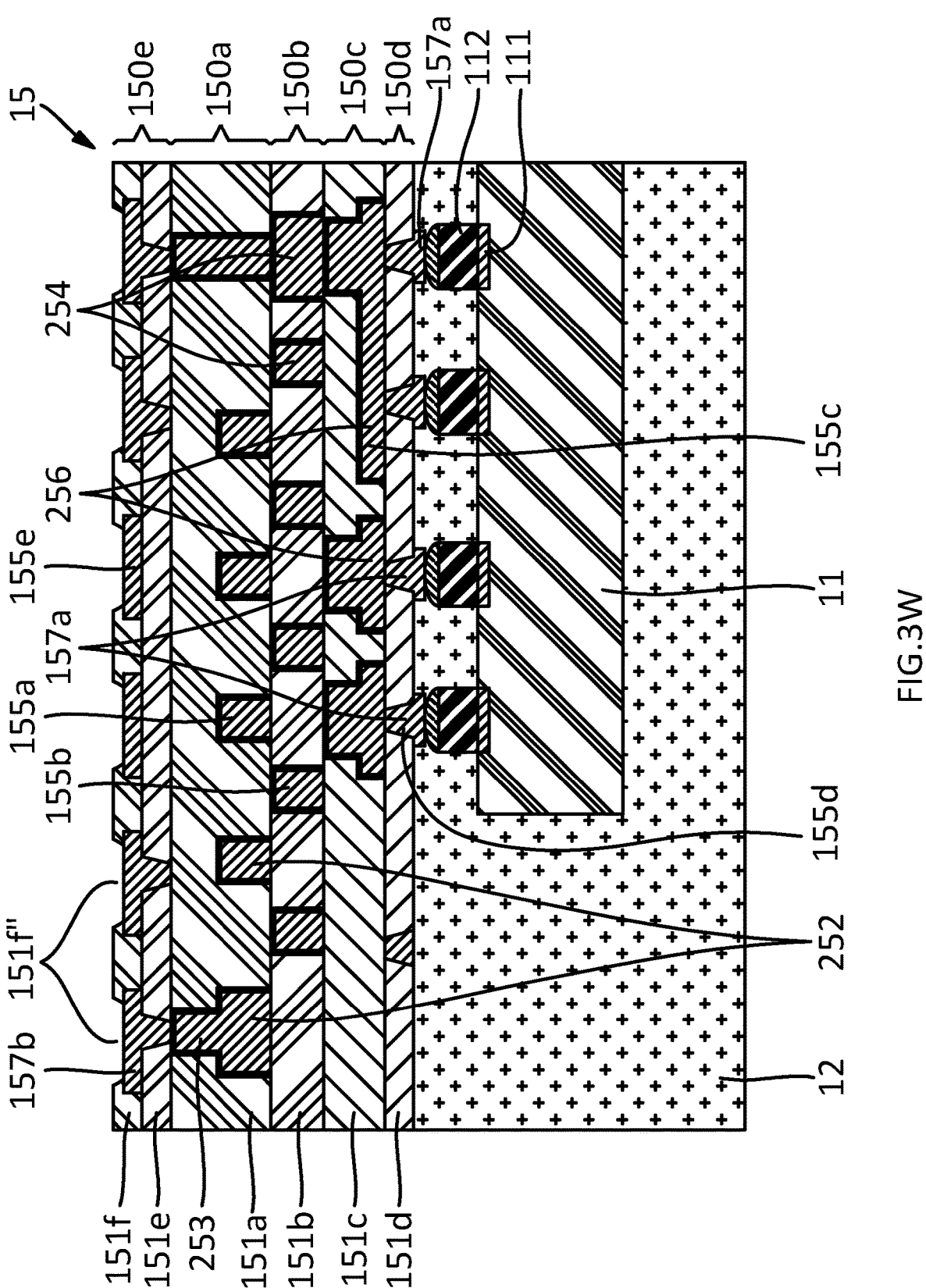
Figure 3X:
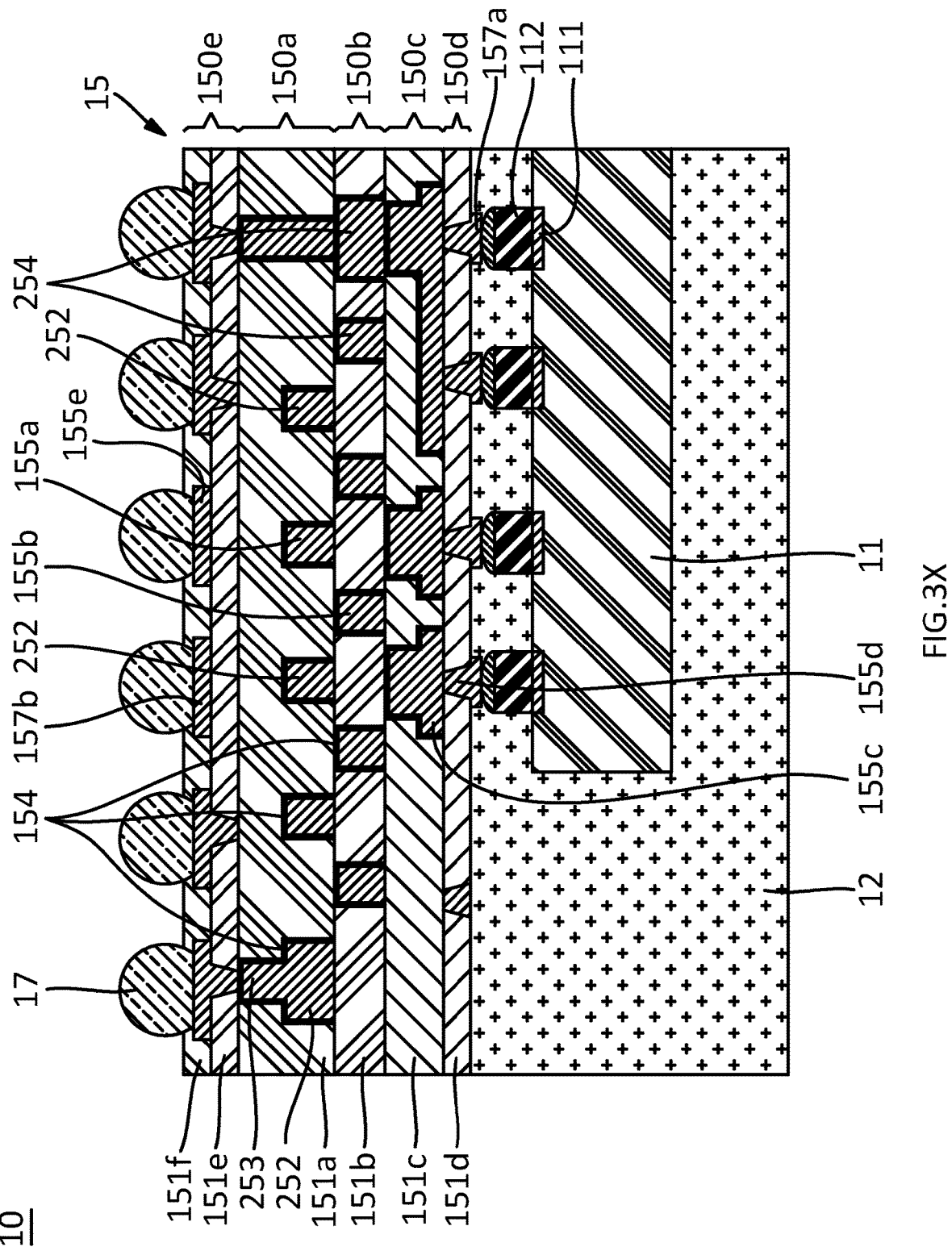

FIGS. 3A to 3X show cross-sectional views for manufacturing electronic device 10 according to the example of FIG. 1. A portion of the manufacturing process of FIG. 3 can comprise or be similar to the manufacturing process of FIG. 2.

FIGS. 3A to 3D present stages of manufacture leading to trace opening 152 and via opening 153 in dielectric 151a. In some examples the manufacturing stages, features, or elements of FIG. 3A to 3D can be correspondingly similar to or same as those described for the manufacturing stages of FIGS. 2A to 2D. For simplicity, contours are shown in FIG. 3 with straight surfaces and square vertices, but such contours can exhibit one or more corresponding sloped surfaces or arcuate vertices as respectively shown and described in FIG. 2.

FIG. 3E shows a later stage of the manufacturing process. In the example of FIG. 3E, seed 154 can be provided on dielectric 151*a*. In some examples, seed 154 can comprise one or more conductive layers, such as of titanium (Ti), titanium tungsten (TiW), nickel vanadium (NiV), or copper (Cu). For instance, one or more layers of Ti, TiW, NiV, or other can be deposited as, for example a barrier layer, and then a Cu layer can be deposited on top. Seed 154 can be provided by various methods including electroless plating, electroplating, and/or sputtering. In some examples, seed 154 can have a thickness in a range from about 0.01 μm to about 1 μm.

FIG. 3F shows a later stage of the manufacturing process. In the example of FIG. 3F, conductor 155*a* can be provided on seed 154 over dielectric 151*a*. For example, conductor 155*a* can comprise, define, or be referred to as one or more conductive layers, conductive structure, conductive material, redistribution layer (RDL), line patterns, conductive patterns, circuit patterns, or conductive paths. In some examples, conductor 155*a* can comprise one or more conductive materials such as copper, gold, or silver. Conductor 155*a* can be provided by various methods such as electroless plating, electroplating, and/or sputtering.

FIG. 3G shows a later stage of the manufacturing process. In the example of FIG. 3G, redistribution level 150*a* of substrate 15 can be established by removing a portion of conductor 155*a* above the top surface of dielectric 151*a* to define one or more traces 252. For example, a removal process of thinning, etching, or polishing, such as by chemical-mechanical polishing (CMP), can thin conductor 155*a* to expose the top side of dielectric 151*a*. In some examples, the remaining portion of conductor 155*a* can be referred as a conductor tier. The removal process defines trace 252 and via 253 in trace pattern 151*t* and via pattern 151*v* of dielectric 151*a*. A top side of trace 252 and a top side of dielectric 151 can be coplanar. In some examples, one or more traces 252 defined as described can be referred to as redistribution layer (RDL) traces.

FIGS. 3H to 3M show later stages of the manufacturing process. In the example of FIGS. 3H to 3M, redistribution level 150*b* (FIG. 3M) can be formed over redistribution level 150*a*. As seen in FIG. 3M, redistribution level 150*b* can comprise dielectric 151*b*, conductor 155*b*, and one or more traces 254, similar to dielectric 151*a*, conductor 155*a*, and one or more traces 252 of redistribution level 150*a*. In some examples, redistribution level 150*b* can also comprise one or more vias similar to one or more vias 253 of redistribution level 150*a*.

In some examples, the stages of FIGS. 3H to 3M for forming redistribution level 150*b* can be correspondingly similar to the stages described with respect to FIGS. 3A to 3G for forming redistribution level 150*a*. For instance, the FIG. 3H stage can be similar to the FIG. 3A stage, the FIG. 3I stage can be similar to the FIG. 3A to 3B stage, the FIG. 3J stage can be similar to the FIG. 3C stage, the FIG. 3K stage can be similar to the FIG. 3D stage, the FIG. 3L stage can be similar to the FIG. 3E stage, and the FIG. 3M stage can be similar to the FIG. 3F stage.

In FIG. 3H, dielectric 151 can be provided over redistribution level 150*a*, similar to as described with respect to dielectric 151*a* for FIG. 3A or 2A.

In FIG. 3I, trace pattern 151*t* can be provided in dielectric 151*b*, similar to as described with respect to trace pattern 151*t* in dielectric 151*a* for FIG. 3B or 2B. In some examples, via pattern 151*v* can be provided in dielectric 151*b*, similar to as described with respect to via pattern 151*v* in dielectric 151*a* for FIG. 3C or 2C.

In FIG. 3J, the unnecessary portion of dielectric 151*b* is removed, similar to as described with respect to the unnecessary portion of dielectric 151*a* for FIG. 3D or 2D.

In FIG. 3K, seed 154 can be provided on dielectric 151*b*, similar to as described with respect to seed 154 on dielectric 151*a* for FIG. 3E.

In FIG. 3L, conductor 155*b* can be provided on seed 154 over dielectric 151*b*, similar to as described with respect to seed 154 over dielectric 151*a* for FIG. 3F.

In FIG. 3M, redistribution level 150*b* of substrate 15 can be established by removing conductor 155*b* above the top surface of dielectric 151*b* to define one or more traces 254, similar to as described with respect to establishing redistribution level 150*a* by removing conductor 155*a* above the top surface of dielectric 151*a* to define one or more traces 252 for FIG. 3G.

As seen in FIG. 3M, one or more conductor 155*b* of redistribution level 150*b* can couple with one or more conductor 155*a* of redistribution level 150*a*. For instance, one or more trace 254 (or corresponding via) can couple with one or more trace 152.

In some examples, as seen in the cross-section view of FIG. 3M and the plan view of FIG. 3M1, traces 254 of redistribution level 150*b* can be arranged such that they alternate or interleave parallel with traces 252 of redistribution level 150*a*. To increase the density of RDL, more RDL lines or traces would need to be arranged in the same area. However, there is a limit to the RDL resolution. Also, there is a limit to making RDL lines, for example trace 254 and conductor 155*b* or trace 252 and conductor 155*a* of FIG. 3M, within a limited area. For example, if the RDL resolution limit is [2 μm line/2 um space] where "line" corresponds to the width of trace 254 in FIG. 3M1, and where "space" corresponds to the interval between traces 254 in FIG. 3M1, the maximum number of parallel traces that can be arranged in a 30 μm space is 7. If, however, parallel traces of RDL of [2 μm line/4 μm space] are arranged interleaved with each other across two redistribution levels as shown in FIG. 3M, then 9 parallel traces can be routed within the same 30 μm space. In such case, the same effect of RDL [2 um line/1 um space] is achieved while using RDL of [2 μm line/4 μm space]. Through such interleaved arrangement, the RDL density may be increased or improved by about 30%.

Additional stages can be performed to provide further redistribution levels for substrate 15. In some examples, the additional stages can provide conductive paths or under bump metallization (UBM).

FIG. 3N shows a later stage of the manufacturing process. In the example of FIG. 3N, redistribution level 150*c* can be defined by forming dielectric 151*c* and conductor 155*c*, with corresponding traces 256 or vias 257, on dielectric 151*b* by, for example, stages similar to those described with respect to FIGS. 3A to 3G for dielectric 151*a* and conductor 155*a*, with corresponding traces 252 or vias 253, of redistribution level 150*a*.

FIG. 3O shows a later stage of the manufacturing process. In the example of FIG. 3O, dielectric 151*d* can be provided over redistribution level 150*c*, on top side of conductor 155*c*, and top side of dielectric 151*c*. In some examples, dielectric 151*d* can be similar to dielectric 151*a*. In some examples, dielectric 151*d* can comprise of be referred as a solder mask. In some examples, dielectric 151*d* can include an electrical insulation material such as a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric 151*d* can be provided by various methods such as spin coating, spray coating, printing, PVD, CVD, MOCVD, ALD, LPCVD, or PECVD. In some examples, dielectric 151*d* can have a thickness in a range from about 1 μm to about 50 μm.

FIG. 3P shows a later stage of the manufacturing process. In the example of FIG. 3P, opening 151*d*″ exposing trace 256 can be provided in dielectric 151*d*. For example, opening 151*d*″ can be provided by etching, laser ablation, or by a photolithographic process. Dielectric 151*d* can expose top side of trace 256 through opening 151*d*″.

FIG. 3Q shows a later stage of the manufacturing process. In the example of FIG. 3Q, redistribution level 150*d* can be established by defining internal terminal 157*a* from conductor 155*d*, covering top side of trace 256 exposed through opening 151*d*″. In some examples, internal terminal 157*a* can be provided by using a photomask and a mask pattern. Internal terminal 157*a* can be connected to trace 256 through opening 151*d*″. Internal terminal 157*a* can comprise or be referred to as a conductor, a conductive material, a conductive layer, a redistribution layer (RDL), a line pattern, a trace pattern, or a circuit pattern, a pad, or an under-bump metallization. Internal terminal 157*a* can be comprise one or more conductive materials, for example copper, gold, or silver. Internal terminal 157*a* can be provided by various methods, for example sputtering, electroless plating, electroplating, PVD, CVD, MOCVD, ALD, LPCVD, or PECVD. In some examples, internal terminal 157*a* can have a thickness in a range from about 1 μm to about 100 μm.

In some examples, such as described in FIGS. 1 to 3, substrate 15 can be a redistribution layer ("RDL") substrate. RDL substrates can comprise one or more conductive redistribution layers and one or more dielectric layers that (a) can be formed layer by layer over an electronic device where the RDL substrate is to be coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photomask material to form a photolithographic mask. The dielectric layers of the RDL substrate can be patterned with a photo-patterning process, and include a photolithographic mask where light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), and/or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In other implementations, substrate 15 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier that is removed after formation of the dielectric and conductive layers and before attachment to the electronic device. The pre-formed substrate can referred to as a printed circuit board (PCB) or a laminate substrate. Such pre-formed substrate can be formed through a semi-additive or modified-semi-additive process.

FIG. 3R shows a later stage of the manufacturing process. In the example of FIG. 3R, electronic component 11 can be coupled with internal terminal 157*a* of substrate 15. In some example, electronic component 11 can include component terminal 111 and component interconnect 112.

In the example of FIG. 3R, electronic component 11 can be coupled to component interconnect 112 through component terminal 111. Electronic component 11 can comprise or be referred to as a semiconductor die, a semiconductor device, or a semiconductor chip. In some examples, electronic component 11 can comprise an integrated circuit, a logic die, a micro-control unit, a memory, a digital signal processor, a network processor, a power management unit, an audio processor, a RF circuit, an antenna structure, a micro-electro-mechanical (MEMS) device, or a wireless baseband system processor. In some examples, electronic component 11 can have a thickness in a range from about 30 μm to about 800 μm. In some example, multiple different electronic components 11 having same or different features or functionalities can be coupled to substrate 15.

In the example of FIG. 3R, at least one component terminal 111 can be provided on a bottom side of electronic component 11. Component terminal 111 can be an input or output terminal, or a power terminal, of electronic component 11. Component terminal 111 can be coupled with component interconnect 112. In some examples, component terminal 111 can be referred to as a die pad or a bond pad. In some examples, component terminal 111 can comprise a conductive material such as aluminum, copper, aluminum alloy, or copper alloy. Component terminal 111 can have a width in a range from about 10 μm to about 100 μm. Component terminal 111 can have a thickness in a range from about 1 μm to about 50 μm.

In the example of FIG. 3R, component interconnect 112 can be provided on component terminal 111. Component interconnect 112 can be coupled with electronic component 11 through component terminal 111. Component interconnect 112 can be coupled with top side of internal terminal 157a. In some examples, component interconnect 112 can be provided by one or more of a ball-drop method, a screen-printing method, or an electroplating method. In some examples, component interconnect 112 can comprise or be referred to as, a conductive ball, a solder ball, a conductive post or pillar, or a solder-capped conductive post or pillar. In some examples, component interconnect 112 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, component interconnect 112 can have a size in a range from about 0 mm to about 0.1 mm.

FIG. 3S shows a later stage of the manufacturing process. In the example of FIG. 3S, encapsulant 12 can cover electronic component 11, internal terminal 157a, and substrate 15. In some examples, encapsulant 12 can comprise or be referred to as, an epoxy molding compound, an epoxy molding resin, or a sealant. In some examples, encapsulant 12 can comprise or be referred to as, a molding part, a sealing part, an encapsulation part, a protection part, a package, a lid, or a body. In some examples, encapsulant 12 can be provided by a compression molding method, a transfer molding method, a liquid encapsulant molding method, a vacuum lamination method, a paste printing method, or a film assist molding method. In some examples, encapsulant 12 can comprise a metallic material such as a lid that covers electronic component 111, or such as a conformal metallic material that conforms to the outer sides of the body of encapsulant 12. In some examples, encapsulant 12 can have a thickness in a range from about 0.03 mm to about 1 mm. Encapsulant 12 can protect electronic component 11 and internal terminal 157a from an external factor or an external environment by covering electronic component 11 and internal terminal 157a. After encapsulant 12 is provided, carrier 160 can be removed and the assembly can be flipped.

FIG. 3T shows a later stage of the manufacturing process, with the assembly flipped from FIG. 3S and with carrier 160 removed. In FIG. 3T, dielectric 151e can be provided on redistribution level 150a of substrate 15, similar to as described with respect to dielectric 151d for FIG. 3O.

In FIG. 3U, openings 151e″ can be provided through dielectric 151e to expose portions of conductors 155a of redistribution level 150a, similar to as described with respect to openings 151d″ through dielectric 151d exposing portions of conductors 155c of redistribution level 150d for FIG. 3P.

In FIG. 3V, redistribution level 150e can be established by conductors 155e defining external terminals 157b coupled to the exposed portions of conductors 155a through openings 151e″ of dielectric 151e, similar to as described with respect to internal terminals 157a coupled to the exposed portions of conductors 155c through openings 151d″ of dielectric 151d for FIG. 3Q.

In FIG. 3W, dielectric 151f can be provided on redistribution level 151e, with openings 151f″ exposing portions of external terminals 157b. In some examples, dielectric 151f can be similar to dielectric 151d in terms of material, features, or formation.

FIG. 3X shows a later stage of the manufacturing process. In the example of FIG. 3X, external interconnect 17 can be connected to external terminal 157b. External interconnect 17 can be coupled with electronic component 11 through substrate 15. In some examples, external interconnect 17 can be provided by a ball-drop method, a screen-printing method, or an electroplating method. In some examples, external interconnect 17 can comprise or be referred to as a conductive ball, a solder ball, or a conductive bump. In some examples, external interconnect 17 can have a size in a range from about 0.1 mm to about 1 mm. With external interconnect 17 is provided, substrate 15 can be flipped to provide the electronic device 10.

FIGS. 4A to 4I show cross-sectional views for another manufacturing process for electronic device 10 according to the example in FIG. 1. Portions of the manufacturing process of FIG. 4 can comprise or bi similar to the manufacturing process or FIG. 2 or 3.

FIGS. 4A to 4E present stages of manufacture leading to trace opening 152 and via opening 153 in dielectric 151a, covered by seed 154. The manufacturing stages, features, or elements of FIG. 4A to 4ED can be correspondingly similar to or same as those described for the manufacturing stages of FIGS. 3A to 3E, or FIGS. 2A to 2D. For simplicity, contours are shown in FIG. 4 with straight surfaces and square vertices, but such contours can exhibit one or more corresponding sloped surfaces or arcuate vertices as respectively shown and described in FIG. 2.

Figures 4A, 4B:
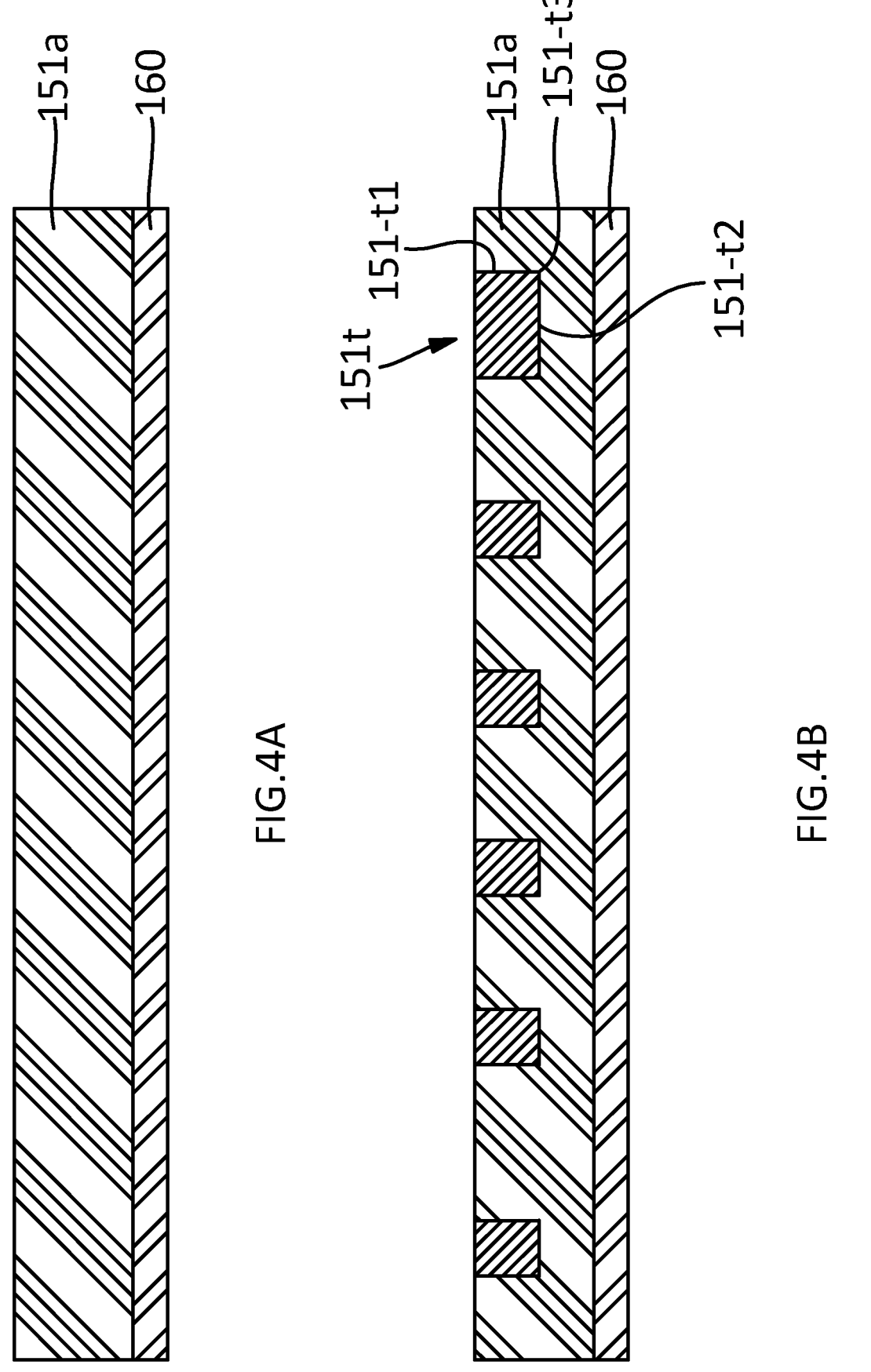
FIGS. 4A to 4I show cross-sectional views of another method for manufacturing the electronic device according to the example in FIG. 1.
Figures 4C, 4D:
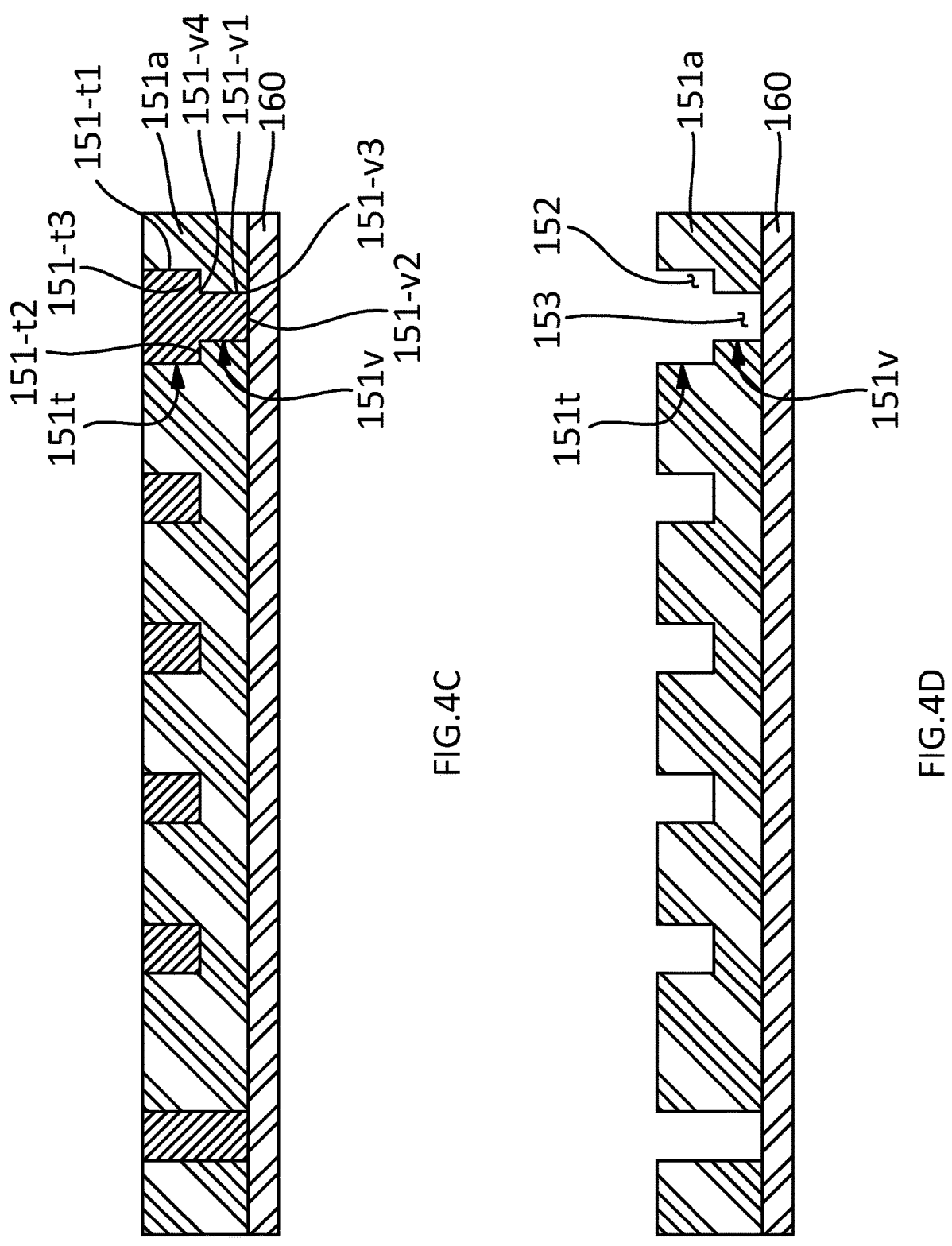
Figures 4E, 4F:
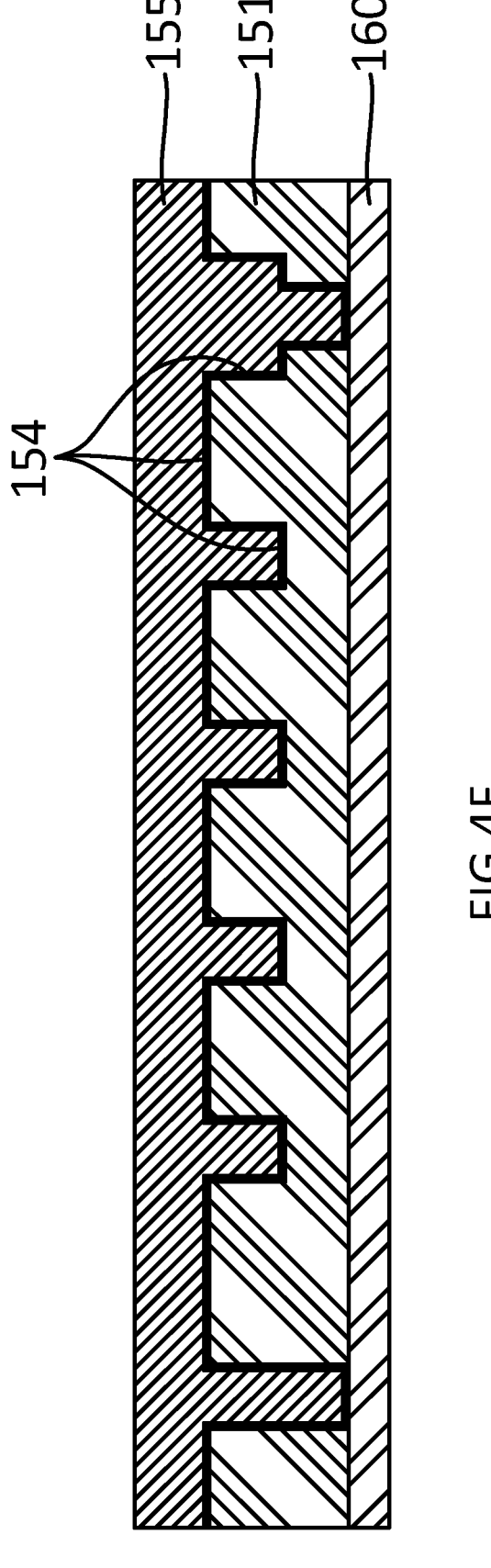

FIG. 4F shows a later stage of the manufacturing process. In the example of FIG. 4F, conductor 155a can be provided on seed 154 over dielectric 151a. The manufacturing stage, features, or elements of FIG. 4F can be similar to those described for the stage of FIG. 3F. In some examples, the thickness of conductor 155a in FIG. 4F can be greater than the thickness of conductor 155a in the stage of FIG. 3F.

In the previous example of FIGS. 3F to 3G, the portion of conductor 155a above the top side of dielectric 151a is removed. In the present example of FIG. 4, as will be described below, part of conductor 155a above the top side of dielectric 151a can be processed to remain and provide an additional redistribution pattern or redistribution level that comprising traces 254 out of the same conductor 155a that provides traces 252.

Figures 4G, 4H:
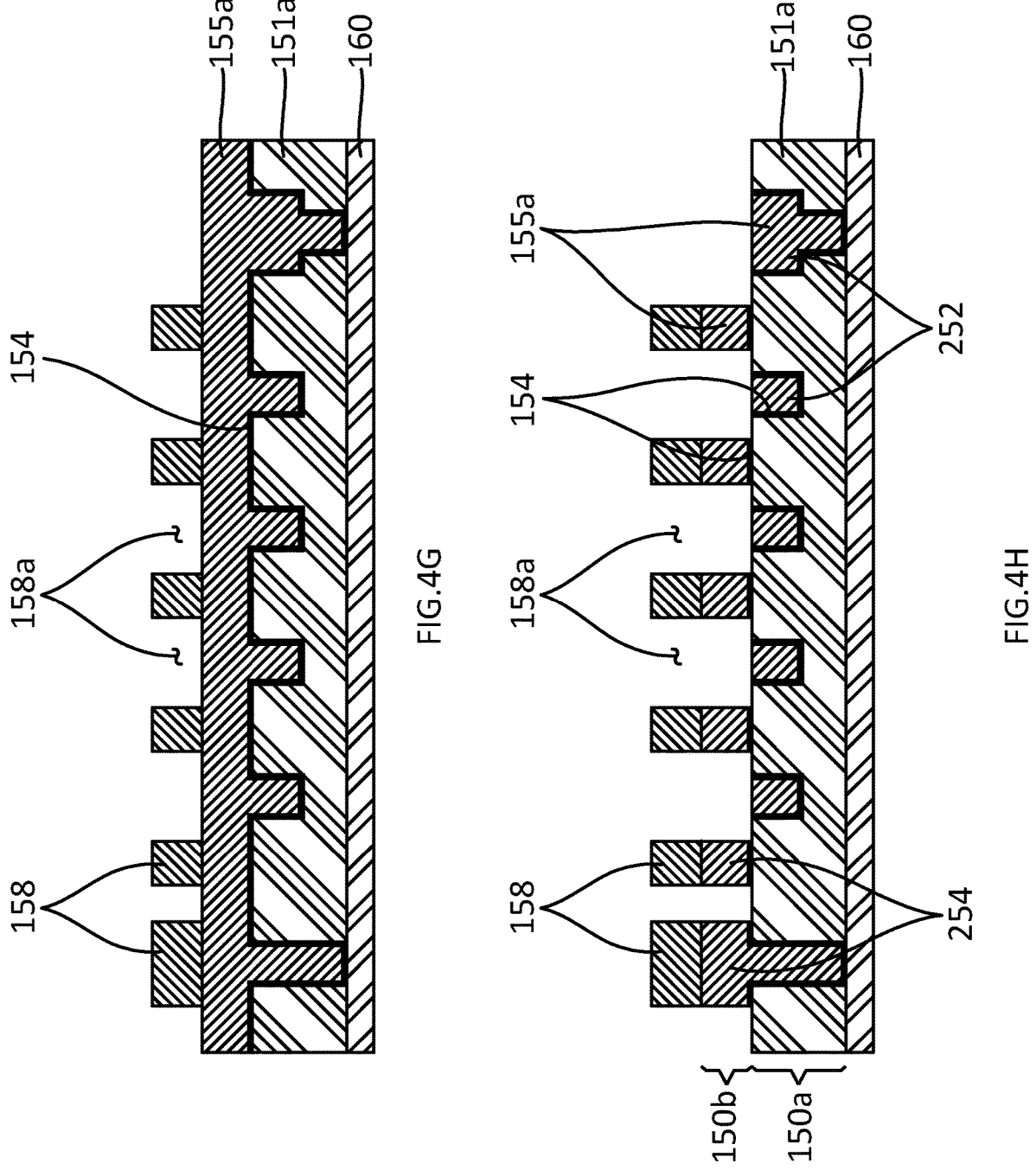

FIG. 4G shows a later stage of the manufacturing process. In the example of FIG. 4G, photomask 158 can be provided on conductor 155a and then exposed by placing a mask thereon to transfer a predetermined pattern. In some examples, photomask 158 can be provided by a spin coating method, spray coating method, dip coating method. A portion of photomask 158 can be developed and removed to define openings 158a. The remaining portion of photomask 158 can serve as a pattern for defining the additional redistribution pattern including traces 254.

FIG. 4H shows a later stage of the manufacturing process. In the example of FIG. 4H, portions of conductor 155a and of seed 154 corresponding to openings 158*a* of photomask 158 can be removed, such as by etching. Portions of conductor 155*a* covered by photomask 158 and defining vias 253, traces 252, and traces 254 can remain. In some examples, the remaining portions of conductor 155*a* can be referred as a conductor tier. Accordingly, redistribution patterns of redistribution level 150*a* and of redistribution level 150*b* can be defined out of the same conductor 155*a* without need to add an additional conductor layer.

Figure 4I:
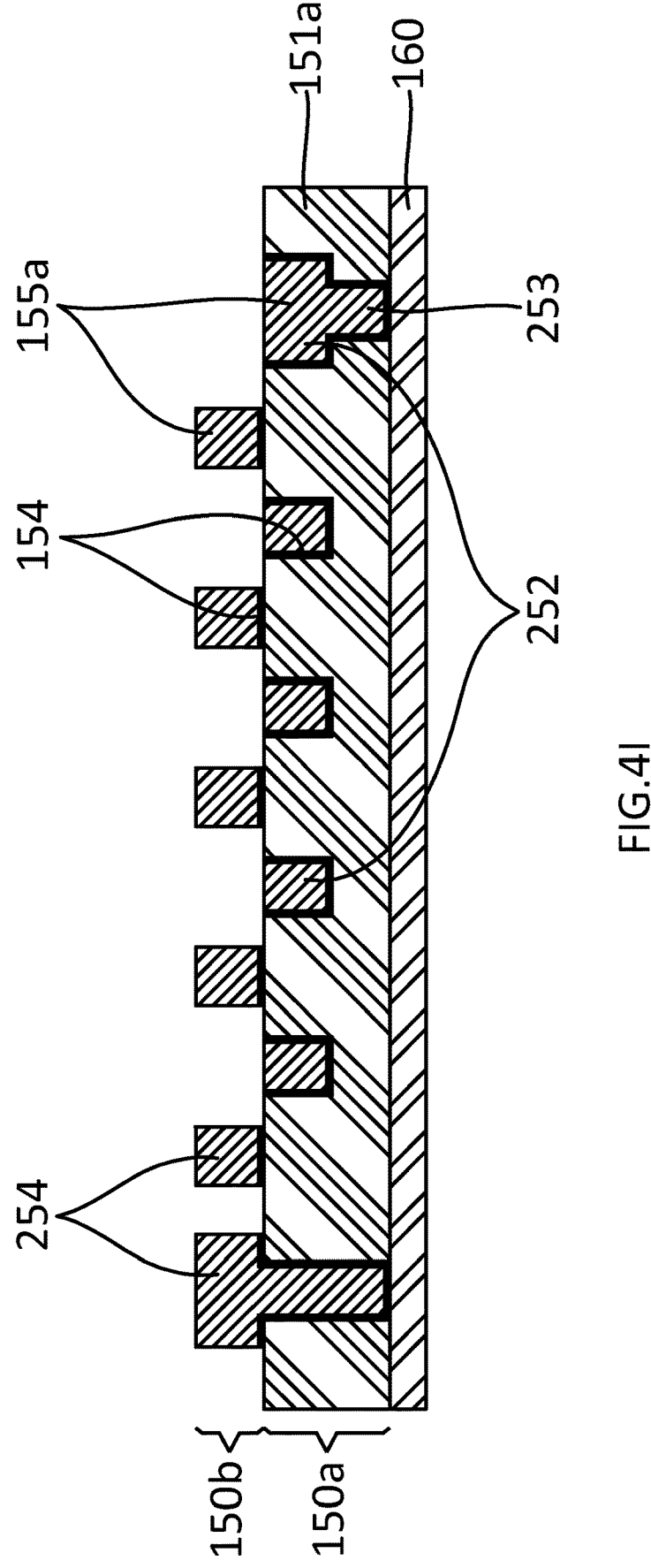

FIG. 4I shows a later stage of the manufacturing process. In the example of FIG. 4I, remaining photomask 158 can be removed. In some examples, a dielectric like dielectric 151*b* can be provided around traces 254 as part of redistribution level 150*b*.

Additional process stages can be performed after the manufacturing stages of FIGS. 4A to 4I. In some examples, the additional stages can provide corresponding processes, elements, or features similar or same as those described for FIGS. 3N to 3W. Through the above-described manufacturing stages, electronic device 10 in FIG. 1 can be provided.

Figure 5:
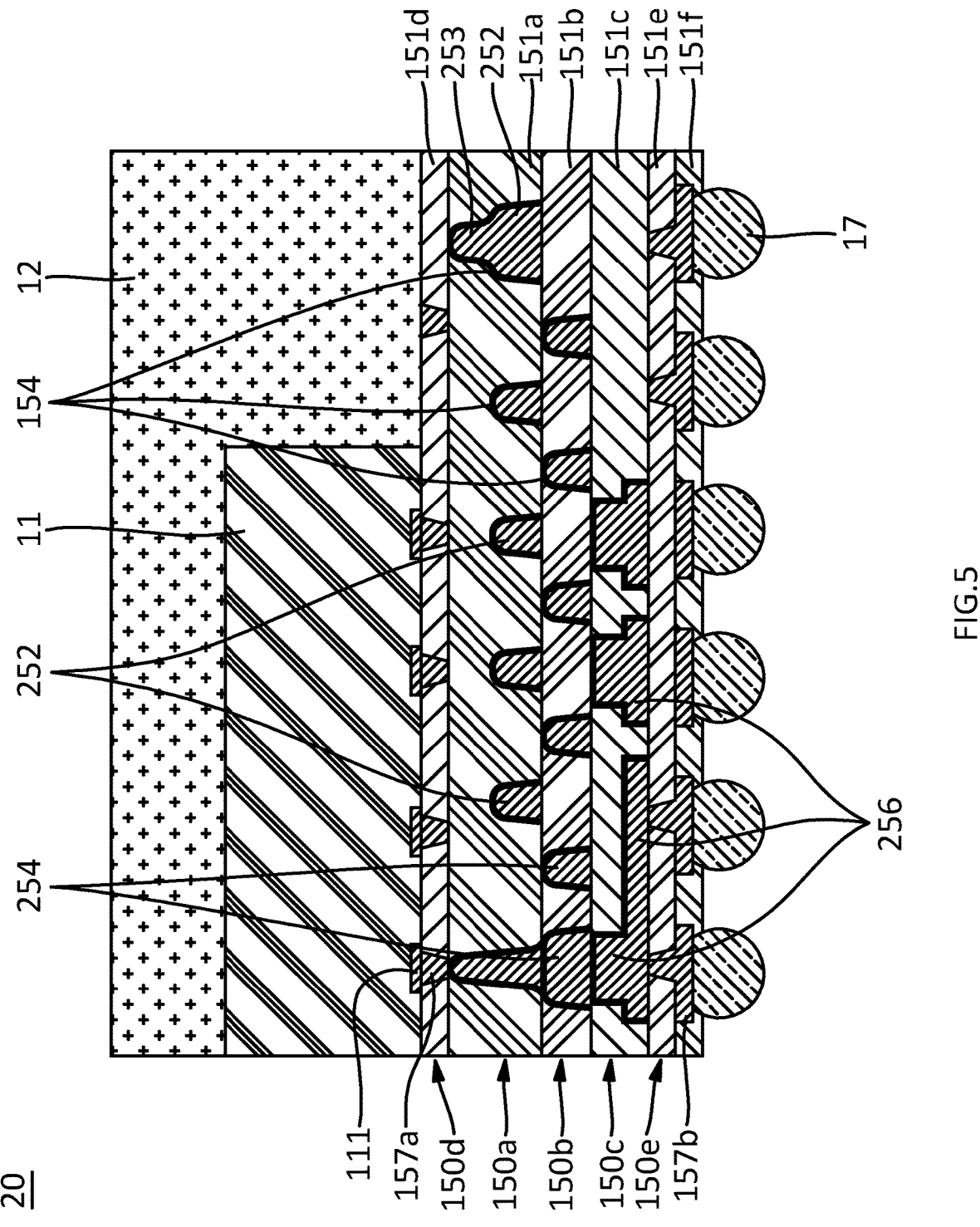
FIG. 5 show a cross-sectional view of an electronic device according to an example.

FIG. 5 shows a cross-section illustrating electronic device 20. Features, elements, and manufacturing of electronic device 20 can be similar to those described above with respect to electronic device 10.

In the example of FIG. 5, the orientation of substrate 15 can be inverted from that shown in FIG. 1 for electronic device 10. Further, substrate 15 can be formed over electronic component 11 and encapsulant 12. FIG. 5 shows component interconnects 112 omitted, but there can be examples where component interconnects 112 can remain, coupled to component terminals 111 and bounded by encapsulant 12, as part of electronic device 20.

In some examples, electronic component 11 can be provided on a carrier. Encapsulant 12 can be provided on the carrier and around electronic component 11. In some examples, with encapsulant 12 in place, the carrier can be removed. Component terminals 111 or component interconnects 112 can be exposed from encapsulant 12, such as by removal of the carrier or by grinding a portion of encapsulant 12.

Dielectric 151*d* can be formed on electronic component 11 and encapsulant 12. Dielectric 151*d* can be patterned to expose component terminals 111 or component interconnects 112. In some examples, dielectric 151*d* can be optional.

Substrate 15 can be formed on electronic component 11 and encapsulant 12 (instead of on carrier 160) according to the processing stages described for FIGS. 2A to 2D, FIGS. 3A to 3N, or FIGS. 4A to 4I. Substrate 15 and electronic device 20 can then be finalized according to the processing stages described for FIGS. 3T to 3X.

Figure 6:
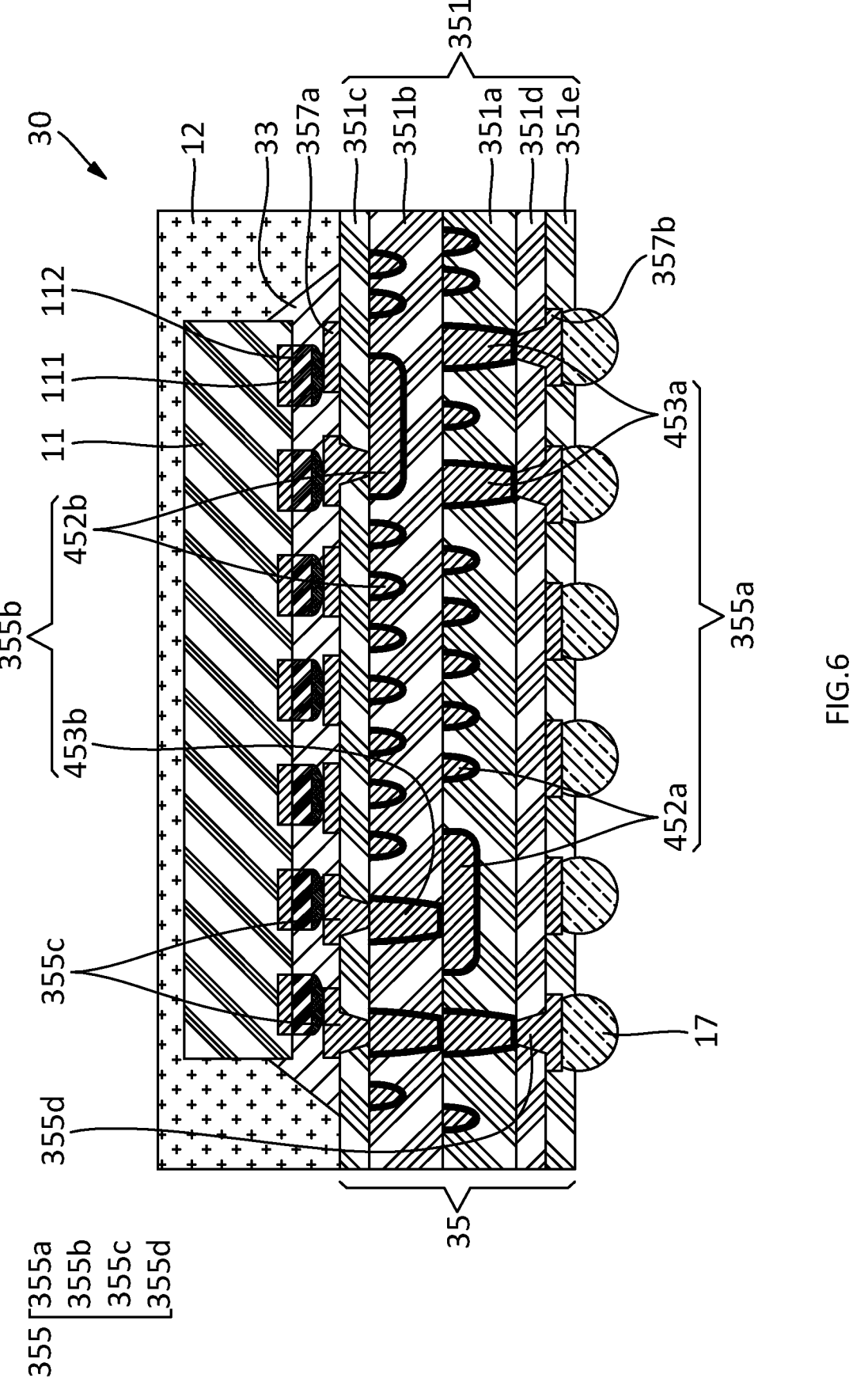
FIG. 6 shows a cross-sectional view of an electronic device according to an example.

FIG. 6 shows cross-sectional view of electronic device 30. In the example of FIG. 6, electronic device 30 can comprise electronic component 11, encapsulant 12, substrate 35 having a top side and a bottom side, and connector 17. Electronic component 11 and encapsulant 12 can be over the top side of substrate 35, and encapsulant can contact a lateral side of electronic component 11. Electronic device 30 can be similar to electronic device 10 described above. For example, electronic component 11, encapsulant 12, and connector 17 of electronic device 20 can be similar to corresponding elements of electronic device 10. Features or elements of substrate 35 can be similar to corresponding ones of substrate 15.

Substrate 35 can comprise conductive structure 355 having conductors 355*a*, 355*b*, 355*c* or 355*d* comprising one or more conductive layers or patterns defining conductive paths, traces, vias, internal terminals 357*a*, or external terminals 357*b*. Substrate 35 can comprise dielectric structure 351 comprising one or more dielectric layers defining dielectrics 351*a*, 351*b*, 351*c*, 351*d* or 351*e* for providing structural integrity, separation, or insulation for conductive structure 355. In some examples, conductor 355*a* can be in dielectric layer 351*a* and can comprise via 453*a* and trace 452*a*, and conductor 355*b* can be in dielectric layer 351*b* and can comprise via 453*b* and trace 452*b*. Traces 452*a* or 452*b* can be exposed from a top side of dielectric layers 351*a* or 351*b*, respectively, and can partially extend through dielectric layers 351*a* or 351*b*, respectively. Vias 453*a* or 453*b* can be exposed from the top side of dielectric layers 351*a* or 351*b*, respectively, and can fully extend through dielectric layers 351*a* or 351*b*, respectively, from a top side of dielectric layers 351*a* or 351*b*, respectively, to a bottom side of dielectric layers 351*a* or 351*b*, respectively. Conductive structure 355 can be coupled with electronic component 11.

In some examples vias 453*a* or 453*b* can have non-stepped sidewalls extending vertically. Such non-stepped sidewalls of vias 453*a* or 453*b* can comprise continuous lines or curves without a trace-to-via transition vertex, or without steps or corners defined by such a transition vertex, in contrast with the stepped sidewalls described with respect to FIG. 2C, FIG. 3C, or FIG. 3G having steps or corners defined by transition vertex 151-*v*4 between trace 252 and via 253.

Figure 7A:
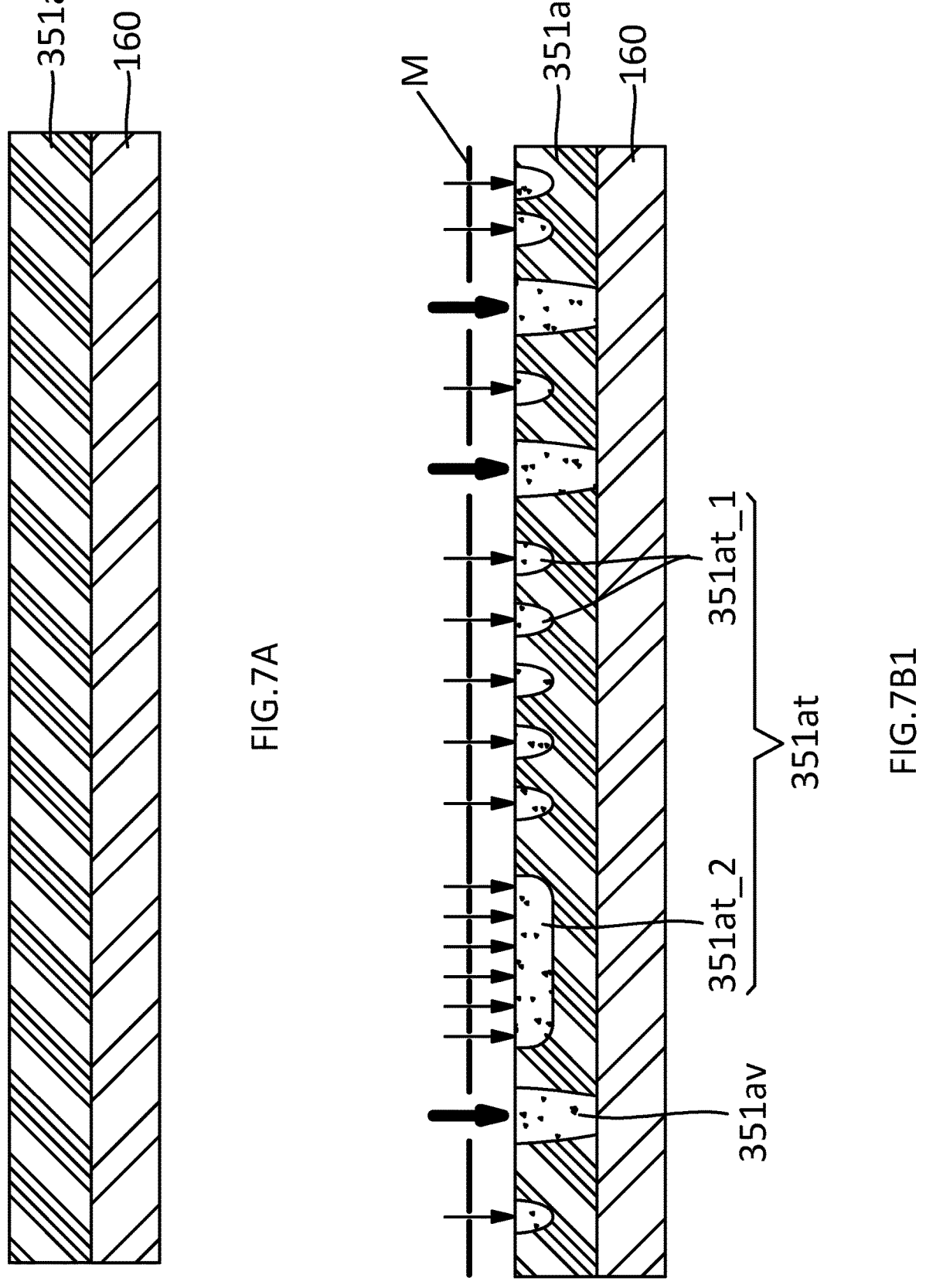
FIGS. 7A to 7P show cross-sectional views of a process for manufacturing the electronic device.
Figures 7C, 7D:
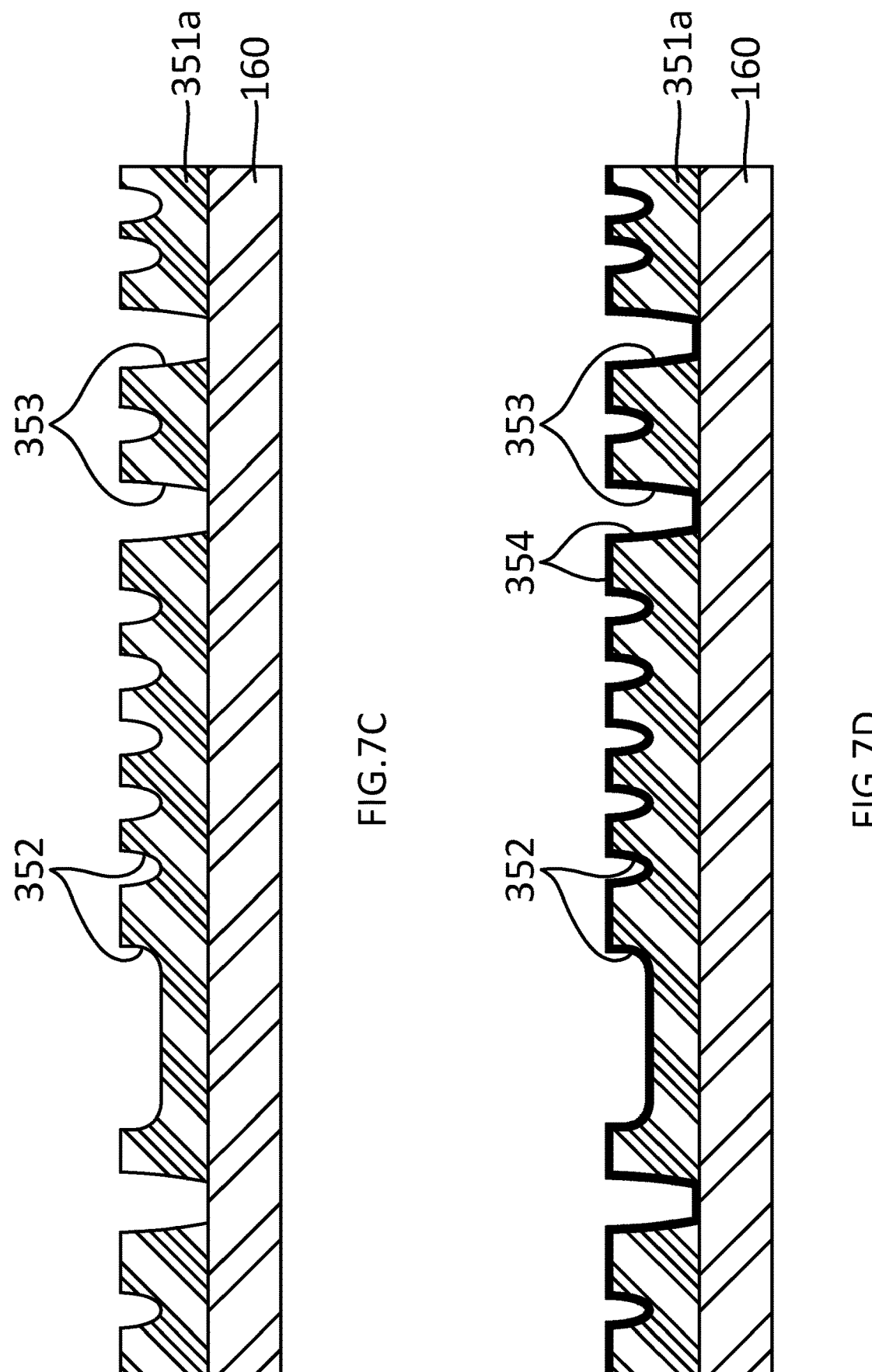
Figures 7E, 7F:
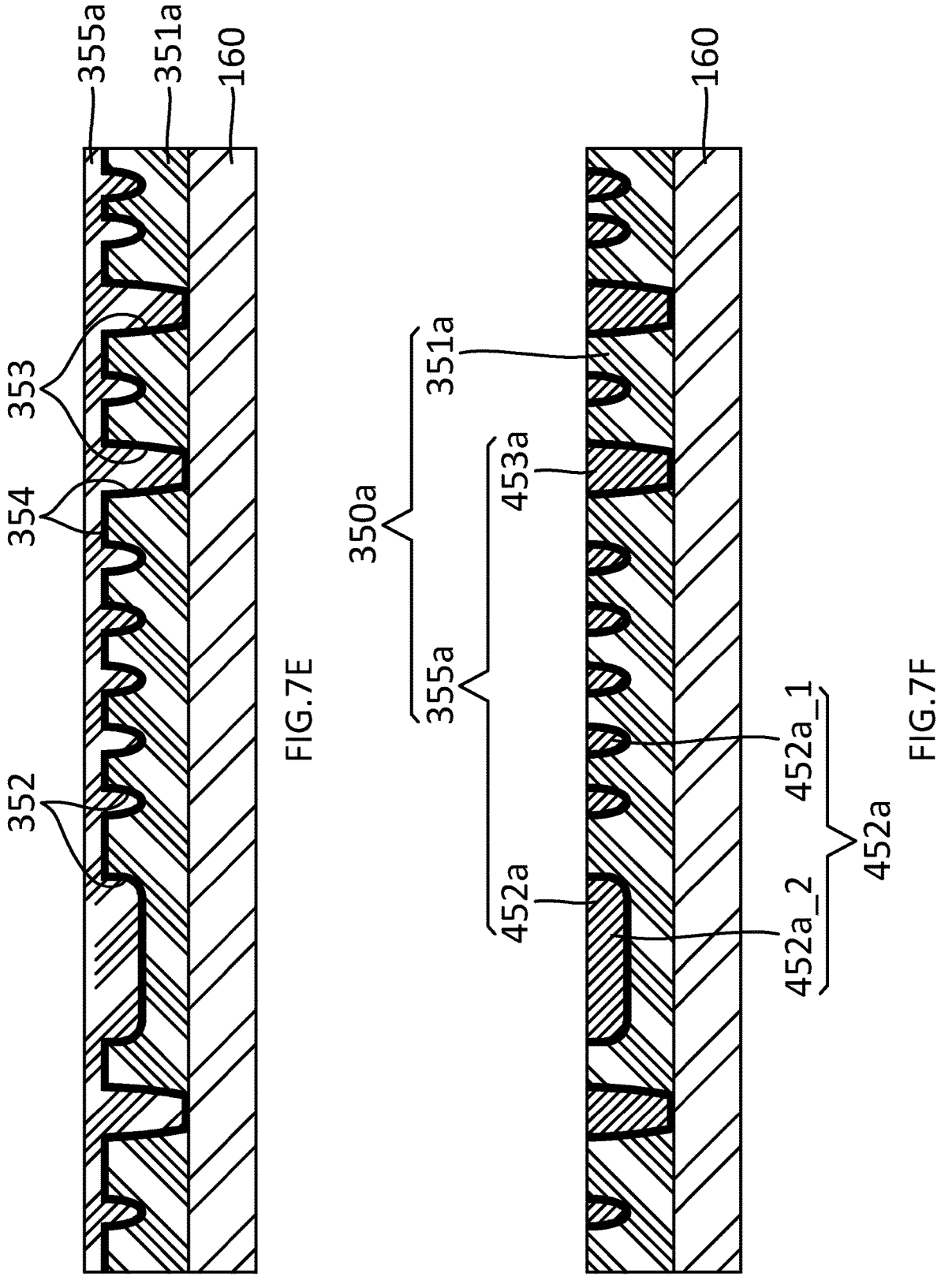
Figures 7G, 7H:
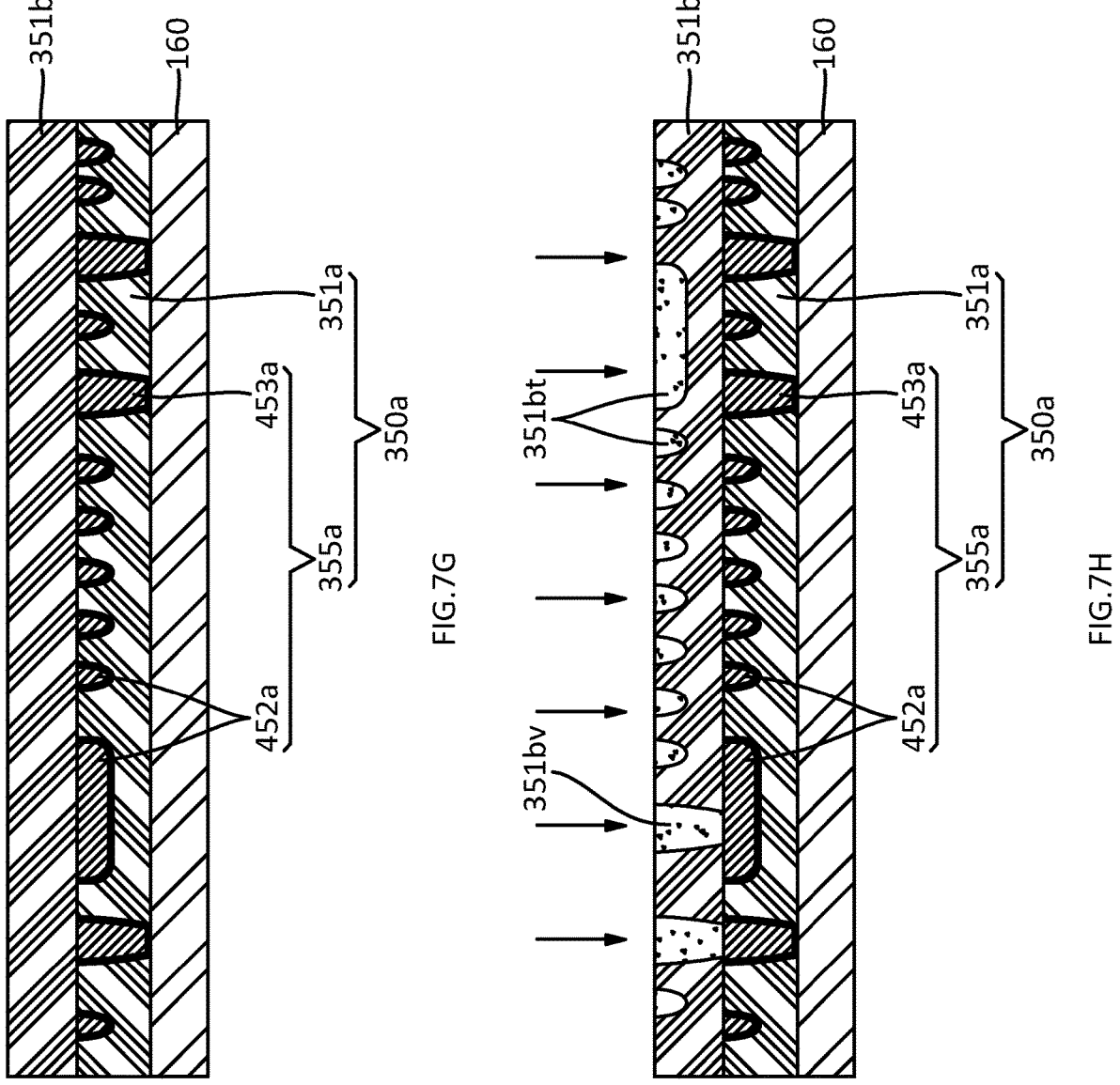
Figures 7I, 7J:
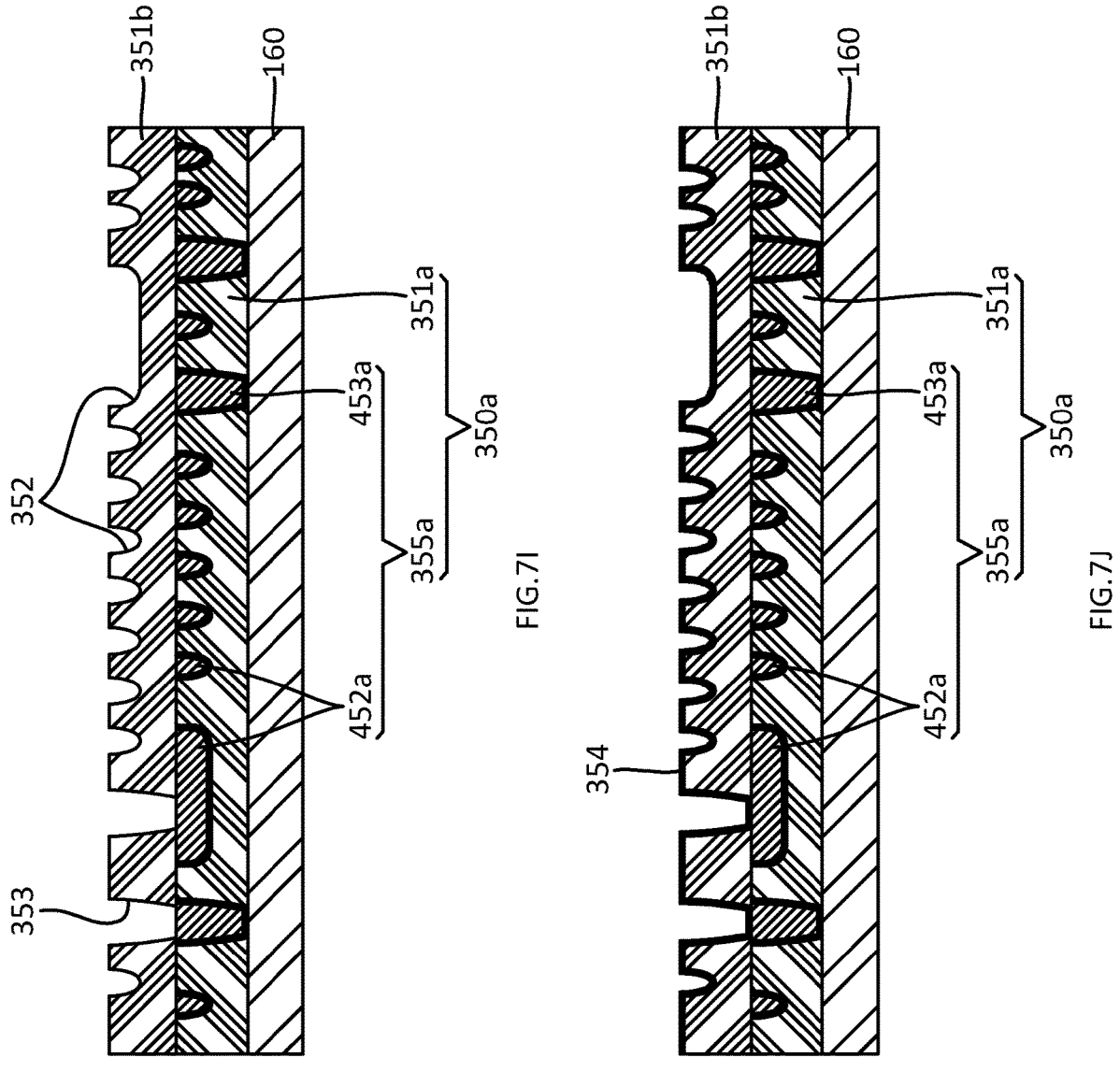
Figures 7K, 7L:
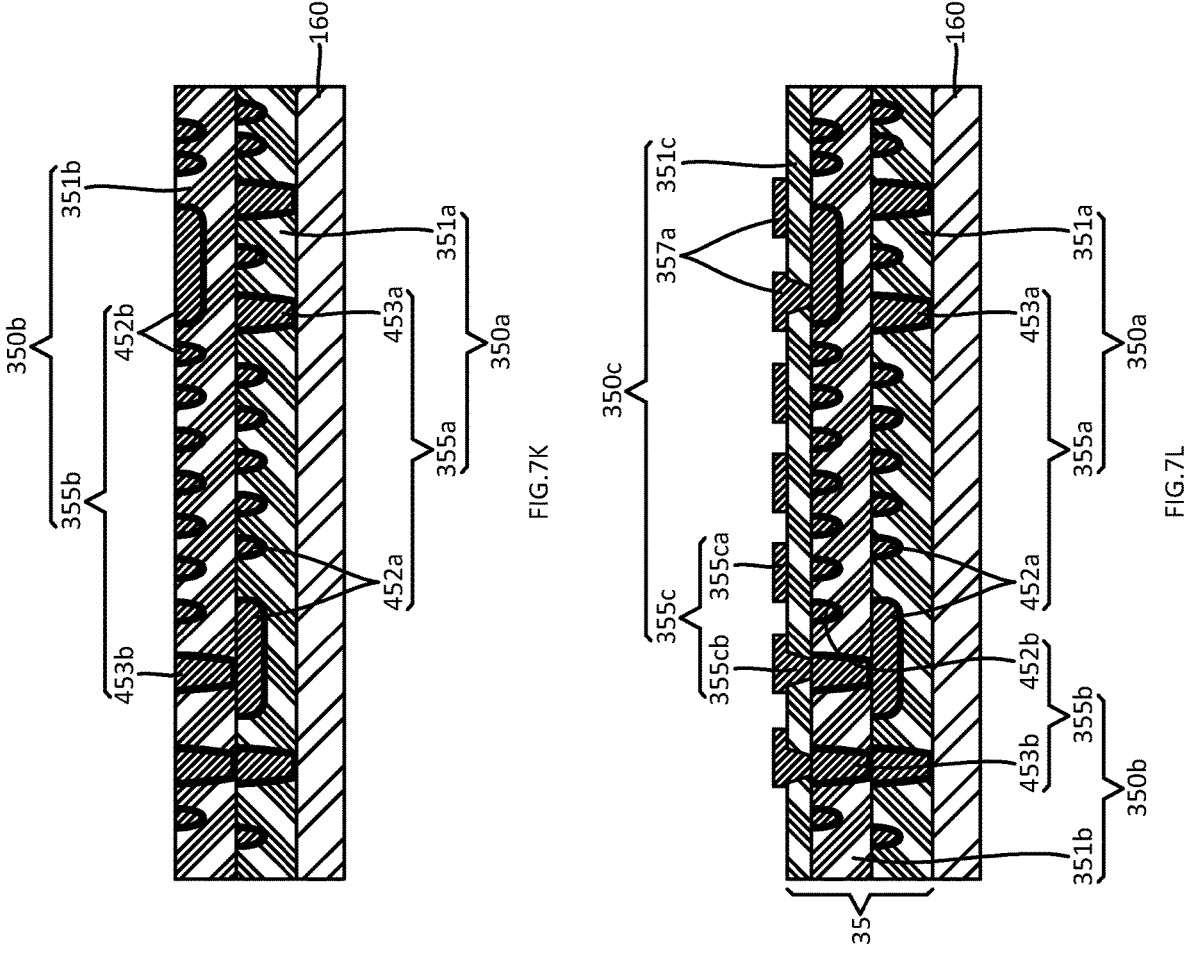
Figure 7M:
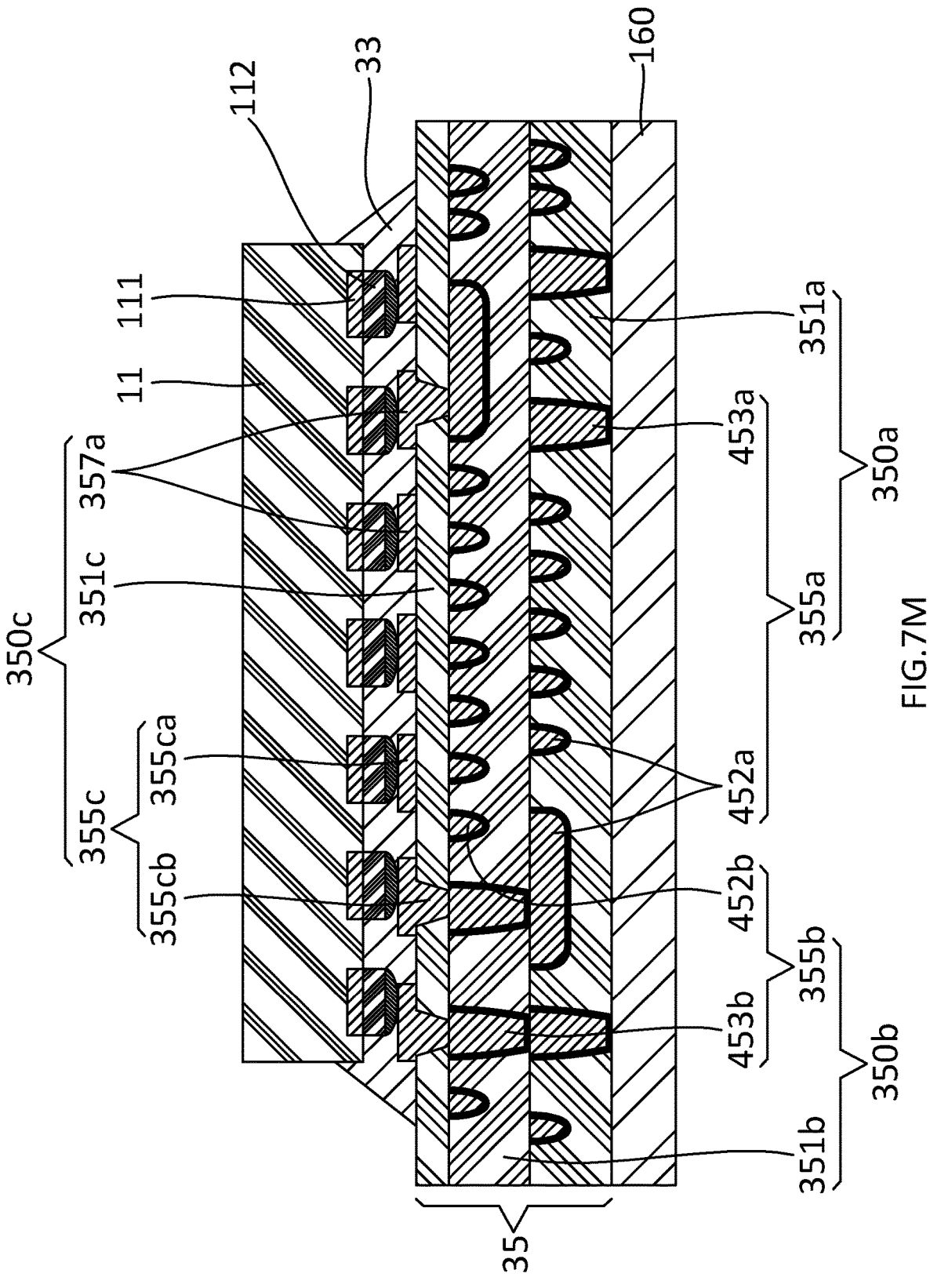
Figure 7N:
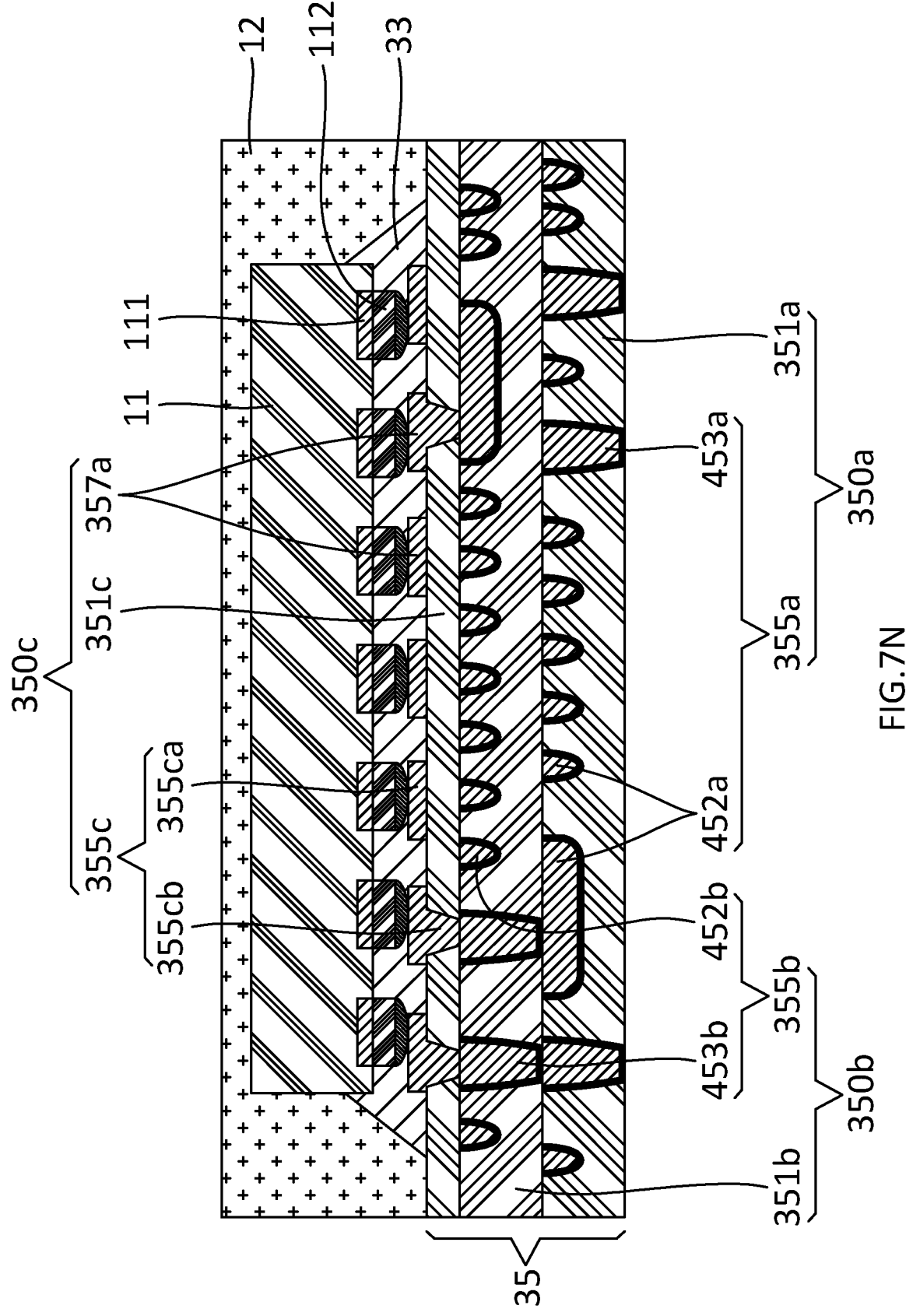
Figure 7O:
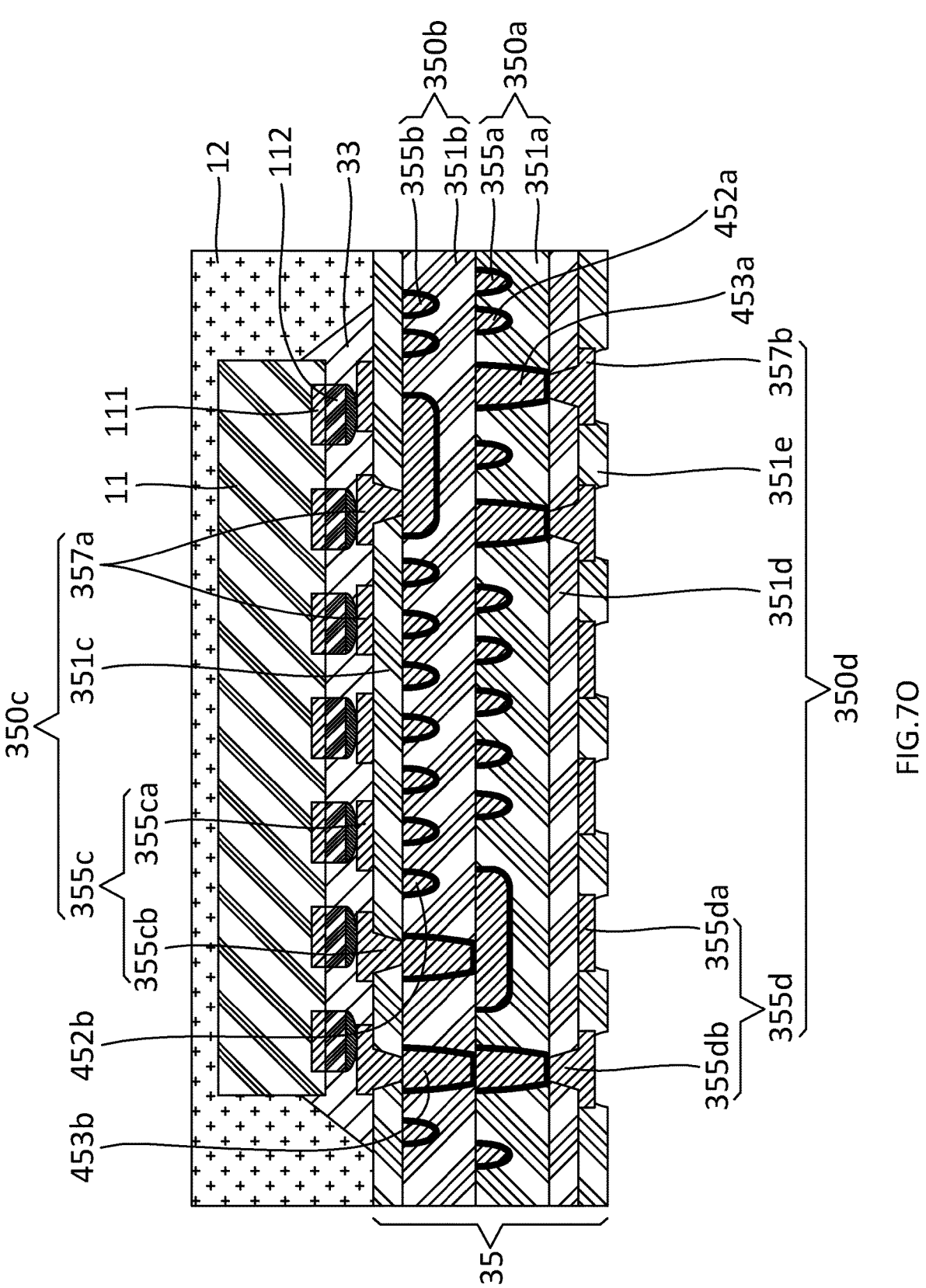
Figure 7P:
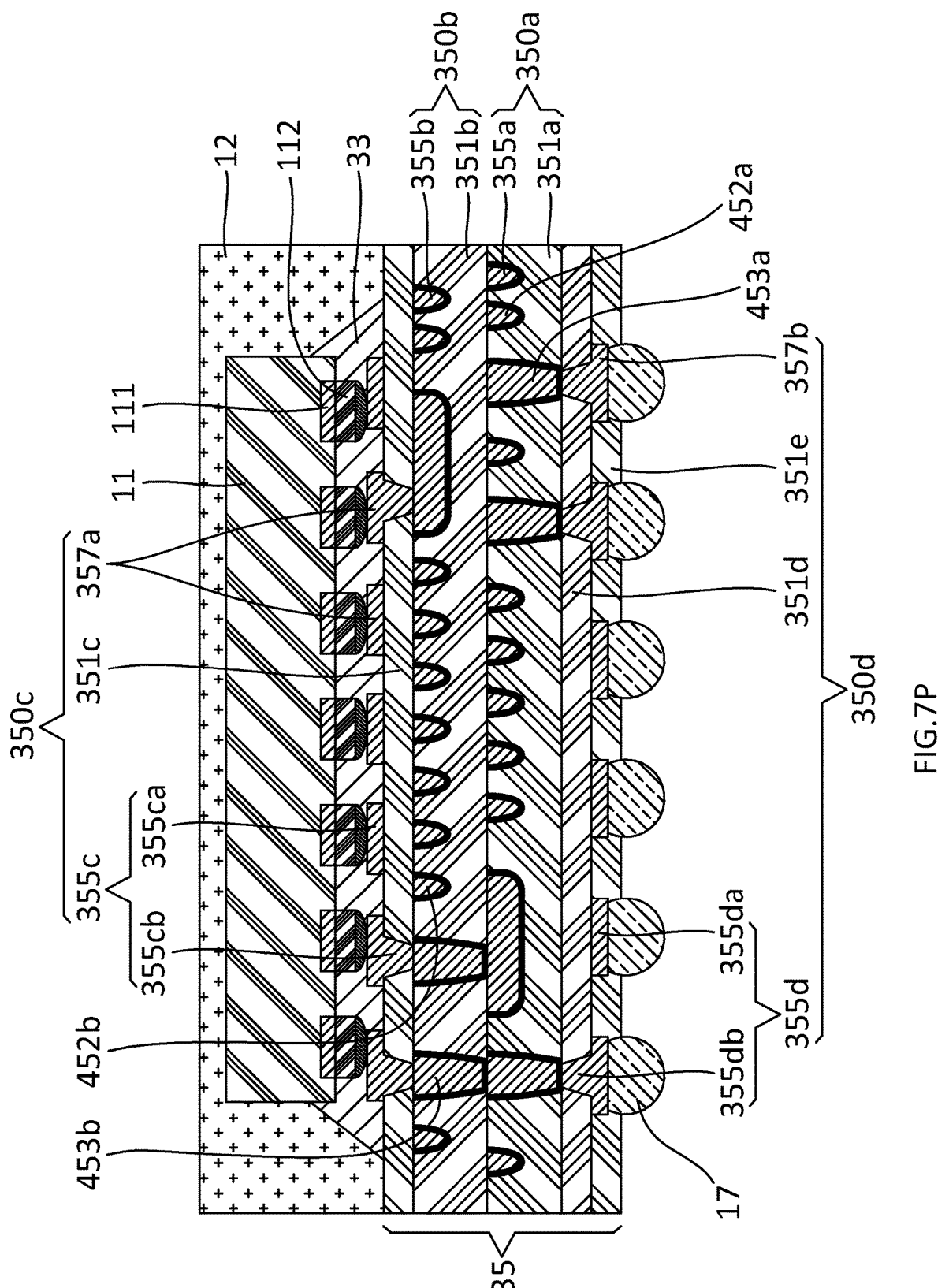

FIGS. 7A to 7P show cross-sectional views of an example method for manufacturing example electronic device 30. FIG. 7A shows a cross-sectional view of electronic device 30 at an early stage of manufacture. In the example shown in FIG. 7A, dielectric layer 351*a* can be provided on the surface of carrier 160. In some examples, dielectric layer 351*a* can comprise corresponding elements, features, materials, or methods of manufacture similar to dielectric layer 351*a* shown in FIG. 2A.

FIGS. 7B1 and 7B2 show cross-sectional views of electronic device 30 at later stages of manufacture. In the example of FIGS. 7B1 and 7B2, trace patterns 351*at* and via patterns 351*av* can be provided on dielectric 351*a*. Trace patterns 351*at* can include fine patterns 351*at*_1 or wide patterns 351*at*_2.

Trace patterns 351*at* and via patterns 351*av* can be used to define a redistribution layer (RDL) pattern. In trace patterns 351*at* and via patterns 351*av*, mask M having slits is aligned on dielectric layer 351*a*, in a lithography tool, and then ultraviolet (UV) light passes through the slits of mask M to be irradiated onto dielectric layer 351*a*. Trace patterns 351*at* and via patterns 351*av* can be simultaneously provided by a single lithography step, singly lithography operation, or single lithography exposure, or one-shot lithography step, one-shot lithography operation, or one-shot lithography exposure, through the same mask M, instead of separate individual lithography steps and individual masks for each of trace patterns 351*at* and via patterns 351*av* to achieve desired patterns in a single step, operation, or exposure, or otherwise in fewer steps, operations, or exposures, than can be attained via standard lithography.

Wide patterns 351*at*_2 can be provided by UV light passing through a group of adjacent narrow slits of mask M separated or spaced apart from each other by narrow pitch. Pitch can be defined as the distance between adjacent slits. The narrow pitch between such adjacent slits causes UV light rays to pass through mask M tightly adjacent to each other such as to generate wide pattern 351*at*_2 into dielectric 351*a* as a continuous wide pattern defined by multiple narrow patterns tightly adjacent and converged with each other, rather than as multiple narrow patterns separated by pitch. The narrow width of such narrow slits can limit the amount or power of passing UV light, to generate wide patterns 351at_2 as shallow patterns that do not extend fully through dielectric 351a.

Fine patterns 351at_1 can be provided by UV light passing through narrow slits of mask M separated from each other by a broad pitch. Because of the broad pitch between them, the light rays passing through the adjacent narrow slits are not tightly adjacent and do not converge, and individual fine patterns 351at_1 can be formed separated by pitch from each other. For example, when the pitch between mask slits is four times or more than the width of the mask slit, the UV light passing through each slit can form each of the individual fine patterns 351at_1 separated by pitch from each other. The narrow width of such narrow slits can limit the amount or power of passing UV light to generate fine patterns 351at_1 as shallow patterns that do not extend fully through dielectric 351a.

In some examples, the narrow widths of the narrow slits for forming wide patterns 351at_2, and the narrow width of the narrow slits for forming fine patterns 351at_1, can be similar to each other. In some examples, the narrow widths of the narrow slits for forming trace pattern 351at can range from approximately 0.005 μm to approximately 10 μm, depending on the material properties of dielectric layer 351a or the UV light provided by the lithography tool.

In some examples, the pitch for forming trace patterns 351at can range from approximately 0.01 μm to approximately 20 μm depending on the material properties of dielectric layer 351a and the UV light provided by the lithography tool.

In some examples, the narrow pitch for forming wide patterns 351at_2 can range from approximately 0.01 μm to approximately 20 μm, and the broad pitch for forming fine patterns 351at_1 can range from approximately 0.02 μm to approximately 40 μm. For example, the broad pitch can be twice or more than the narrow pitch, depending on the material properties of dielectric layer 351a and the UV light provided by the lithography tool.

In some examples, fine patterns 351at_1 and wide patterns 351at_2 can be provided so as to have similar shallow depth. For example, the depth of fine pattern 351at_1 and wide pattern 351at_2 can be approximately 20% to approximately 80% of the depth of dielectric layer 351a.

Via patterns 351av can be provided by UV light passing through broad slits of mask M. For example, in mask M, the broad width of such broad slits of mask M for via pattern 351av can be greater than the narrow width of the narrow slits of mask M for trace patterns 351at. The broad width of such broad slits of mask M can permit greater amount of power of passing UV light to generate via patterns 351av as deep patterns that can extend fully through dielectric 351a.

In some examples, the broad width of such broad slits of mask M for via pattern 351av can range from approximately 0.1 μm to approximately 100 μm depending on the material properties of dielectric layer 351a and the UV light provided by the lithography tool. For example, the broad widths can be twice or more than narrow widths of the narrow slits for forming trace pattern 351at depending on the material properties of dielectric layer 351a and the UV light provided by the lithography tool.

Via patterns 351av disposed on dielectric layer 351a can be defined deeper than the depth where trace patterns 351at are defined. Via pattern 351av can extend from the top surface to the lower surface of dielectric layer 351a and can be provided to fully penetrate dielectric layer 351a. Via pattern 351a can reach the upper surface of carrier 160. For example, when the amount of UV light or power passing through mask M to expose via pattern 351av can be about 100%, the amount of UV light or power passing through mask M to expose trace pattern 351at can be about 50% or less. The magnitude of the UV light passing through the mask M may be different depending on the size and pitch of the slits or openings.

FIG. 7C shows a cross-sectional view of electronic device 30 at a later stage of manufacture. In the example shown in FIG. 7C, unnecessary portions of dielectric layer 351a can be removed by development and curing. For example, trace opening 352 and via opening 353 can be respectively defined by removing respective portions of dielectric 351a for trace pattern 351at and via pattern 351av using a developer. Via opening 353 can expose the upper surface of carrier 160 though dielectric layer 351a. Trace openings 352 are shallower than via openings 353 and do not extend fully through dielectric 351a.

Trace openings 352 can include a substantially straight sidewall extending vertically downward from the upper surface of dielectric layer 351a, and a base connected to the lower portion of the sidewall. In some examples, trace opening 352 can include an arcuate vertex convex toward dielectric layer 351a between the sidewall and the base. In some examples, trace openings 352 can have an arcuate shape with a base convex toward dielectric layer 351a. In some examples, trace openings 352 can comprise or be referred to as shallow openings. In some examples, trace openings 352 or via openings 353 can respectively have non-stepped sidewalls without a trace-to-via transition vertex such as vertex 151-v4 shown in FIG. 2C, FIG. 3C, or FIG. 3G. Although FIG. 7C shows the sidewalls of trace openings 352 or via openings 353 as comprising concave sidewalls, in other examples the sidewalls can be convex, and the scope of the disclosed subject matter is not limited in this respect.

Via opening 353 can have a substantially straight sidewall extending vertically from the upper surface of dielectric layer 351a to the upper surface of carrier 160. In some examples, a bottom portion of the sidewall of via opening 353 can be arcuate. Via opening 353 can comprise or be referred to as a deep opening.

FIG. 7D shows a cross-sectional view of electronic device 30 at a later stage of manufacture. In the example shown in FIG. 7D, seed 354 can be provided on the dielectric layer 351a. Seed 354 can be provided to uniformly cover trace opening 352, via opening 353, and the upper surface of dielectric layer 351a. Seed 354 can include one or more conductive layers. Seed 354 can comprise or be referred to as a conductive layer, a seed layer, a buffer layer, or a barrier layer. Seed 354 can include corresponding elements, features, or materials similar to those of seed 154 shown in FIG. 3E. In this example, seed 354 can be provided to cover the sidewalls of trace opening 352 and the base, the sidewalls of via opening 353, and the exposed upper surface of carrier 160. In some examples, seed 354 can be provided by electroless plating, electrolytic plating, sputtering, PVD, CVD, MOCVD, ALD, LPCVD, or PECVD.

FIG. 7E shows a cross-sectional view of electronic device 30 at a later stage of manufacture. In the example shown in FIG. 7E, conductor 355a can be provided on dielectric layer 351a via seed 354. Conductor 355a can be provided on trace openings 352, via openings 353, and dielectric layer 351a to uniformly cover seed 354. Conductor 355a can be provided by plating, whether electroless plating or electrolytic plating using seed 354 as a seed layer or can be provided by sputtering or vapor deposition. Seed 354 can be considered as a portion of conductor 355*a*. Conductor 355*a* can include corresponding elements, features, materials, or methods of manufacture similar to those of conductor 155*a*.

FIG. 7F shows a cross-sectional view of electronic device 30 at a later stage of manufacture. In the example shown in FIG. 7F, the upper surface of dielectric layer 351*a* can be exposed by removing an upper portion of conductor 355*a*. The upper portion of conductor 355*a* can be removed to define traces 452*a* and vias 453*a*. In some examples, the remaining portions of conductor 355*a* can be referred as a conductor tier. Traces 452*a* and vias 453*a* can be respectively located inside trace openings 352 and via openings 353 of dielectric layer 351*a*. The upper surface of traces 452*a*, vias 453*a*, and dielectric layer 351*a* can be disposed on the same plane. Traces 452*a* and vias 453*a* can comprise a conductor and a seed, respectively. Traces 452*a* and vias 453*a* can be electrically isolated from each other by dielectric layer 351*a*. Traces 452*a* and vias 453*a* can be exposed from the upper surface of dielectric layer 351*a*, and vias 453*a* can be exposed from the lower surface of dielectric layer 351*a*.

Traces 452*a* and vias 453*a* can have substantially straight sidewalls extending vertically. In some examples, trace 452*a* can have a lower surface connected to the lower portion of the sidewall and can include an arcuate vertex convex toward dielectric layer 351*a* between the sidewall and the lower surface. In some examples, trace 452*a* can have an arcuate shape with a lower surface convex downward. In some examples, traces 452*a* or vias 453*a* can respectively have non-stepped sidewalls without a trace-to-via transition vertex such as vertex 151-*v*4 shown in FIG. 2C, FIG. 3C, or FIG. 3G.

Although FIG. 7F shows the sidewalls of traces 452*a* or vias 453*a* comprising convex sidewalls that are convex laterally, or that otherwise bulge outwardly, in other examples the sidewalls can be concave laterally, and the scope of the disclosed subject matter is not limited in this respect.

In some examples, traces 452*a* can include fine traces 452*a*_1 and wide traces 452*a*_2. Fine traces 452*a*_1 can correspond to fine patterns 351*at*_1, and wide traces 452*a*_2 can correspond to wide patterns 351*at*_2 (FIGS. 7B1 and 7B2). In some examples wide traces 452*a*_2 can be defined as multiple fine traces similar to fine traces 452*a*_1 but tightly adjacent and converged with each other with a sufficiently small pitch between them to result in a single wide trace structure. In some examples, wide traces 452*a*_2 can have a width that is greater than the individual widths of fine traces 452*a*_1.

In some examples, fine traces 452*a*_1 can have a width in a range from approximately 0.005 micrometers (μm) to approximately 10 μm and can be spaced apart at a pitch in a range from approximately 0.02 μm to approximately 40 μm on the topside. In some examples, wide trace 452*a*_2 can have a width in a range from approximately 0.1 μm to approximately 100 μm. For example, a width of wide trace 452*a*_2 can be twice or more than a width of fine trace 452*a*_1. For example, wide trace 452*a*_2 can include an arcuate vertex convex toward dielectric layer 351*a* between the sidewall and the lower surface, and fine trace 452*a*_1 can have an arcuate shape with a lower surface convex downward.

Conductor 355*a* can comprise or be referred to as a conductive structure, a conductive material, a conductive layer, a redistribution layer (RDL), a wiring pattern, or a circuit pattern. Trace 452*a* can comprise or be referred to as a lateral path, a pad, or a terminal. Via 453*a* can comprise or be referred to as a vertical path or a conductive path. In some examples, via 453*a* can have a width in a range from approximately 0.1 μm to approximately 100 μm on the topside.

In some examples, an upper portion of conductor 355*a* can be removed by chemical-mechanical polishing (CMP) or etching. In some examples, the height of via 453*a* can be the same as the height of dielectric layer 351*a*. In some examples, the maximum plane size of via 453*a* can be smaller than the plane size of a corresponding via structure comprising portions 252 and 253 provided by applying a double exposure process such as shown in FIGS. 1 and 2D. Due to a reduction in the width of via 453*a*, the degree of integration can be enhanced. In some examples, trace 452*a* can comprise or be referred to as a redistribution layer (RDL) trace, and via 453*a* can comprise or be referred to as a redistribution layer (RDL) via.

In some examples, dielectric layer 351*a*, traces 452*a* and vias 453*a* can be referred to as or comprise redistribution level 350*a*. Since redistribution level 350*a* can define trace opening 352 and via opening 353 in dielectric layer 351*a* by a single lithography step or one-shot lithography, the manufacture can be simplified. As shown in FIGS. 7A to 7F, the number of process steps, operations, or exposures, can be reduced, the process speed can be increased, or the degree of integration can be increased by reducing the planar size of via 453*a*. In some examples, vias 453*a* can comprise single, continuous, monolithic structures. In some examples, traces 452*a* and vias 453*a* can be defined by a single, continuous layer of metal or other conductive material. In some examples, a full height of the first trace comprises a continuous monolithic trace portion of a single layer of conductive material, and a full height of the first via comprises a continuous monolithic via portion of the single layer of conductive material.

FIGS. 7G to 7K show cross-sectional views of electronic device 30 at later stages of manufacture. In the example shown in FIGS. 7G to 7K, redistribution level 350*b* can be provided on redistribution level 350*a* of substrate 35. Redistribution level 350*b* can include a dielectric layer 351*b*, traces 452*b*, and vias 453*b*. The method of manufacturing redistribution level 350*b* shown in FIGS. 7G-7K can include corresponding elements, features, materials, or methods of manufacturing similar to those of redistribution level 350*a* shown in FIGS. 7A-7F. A bottom of via 453*b* can be coupled to trace 452*a* or via 453*a* of redistribution level 350*a*.

In some examples, the stages of FIGS. 7G to 7K for forming redistribution level 350*b* can be correspondingly similar to the stages described with respect to FIGS. 7A to 7F for forming redistribution level 350*a*. For instance, the FIG. 7G stage can be similar to the FIG. 7A stage, the FIG. 7H stage can be similar to the FIG. 7B stage, the FIG. 7I stage can be similar to the FIG. 7C stage, the FIG. 7J stage can be similar to the FIG. 7D stage, and the FIG. 7K stage can be similar to the FIGS. 7E and 7F stage. In some examples, the mask used at the FIG. 7H stage can be the same mask as used for the FIG. 7B stage (FIG. 7B1 and FIG. 7B2), or a different mask can be used.

In FIG. 7G, dielectric 351*b* can be provided over redistribution level 350*a*, similar to as described with respect to dielectric 351*a* for FIG. 7A. In FIG. 7H, trace pattern 351*bt* and via pattern 351*bv* can be provided in dielectric 351*b*, similar to as described with respect to trace pattern 351*at* and via pattern 351*av* in dielectric 351*a* for FIG. 7B. In FIG. 7I, unnecessary portions of dielectric 351*b* are removed, similar to as described with respect to unnecessary portions of dielectric 351a for FIG. 7C. In FIG. 7J, seed 354 can be provided on dielectric 351b, similar to as described with respect to seed 354 on dielectric 351a for FIG. 7D.

In FIG. 7K, conductor 355b can be provided on seed 354 over dielectric 351b, and top portions of conductor 355b can be removed similar to as described with respect to conductor 355a over dielectric 351a for FIGS. 7E and 7F. In some examples, redistribution level 350b of substrate 35 can be established by removing conductor 355b above the top surface of dielectric 351b to define one or more traces 452b and vias 453b, similar to as described with respect to establishing redistribution level 350a by removing conductor 355a above the top surface of dielectric 351a to define one or more traces 452a and vias 453a. In some examples, the remaining portion of conductor 355b can be referred as a conductor tier.

One or more via 453b of redistribution level 350b can couple with one or more conductor 355a of redistribution level 350a. For instance, one or more via 453b can couple with one or more trace 452a or via 453a. Additional stages can be performed to provide further redistribution levels for substrate 35. In some examples, the additional stages can provide conductive paths or under bump metallization (UBM).

FIG. 7L shows a cross-sectional view of electronic device 30 at a later stage of manufacture. In the example shown in FIG. 7L, redistribution level 350c can be provided above redistribution level 350b. Redistribution level 350c can comprise conductor 355c and dielectric layer 351c. Dielectric layer 351c can uniformly cover an upper portion of redistribution level 350b and can then be provided with an aperture exposing one or more vias 453b or traces 452b. Conductor 355c can comprise trace 355ca extending along the upper surface of dielectric layer 351c and via 355cb filling the aperture of dielectric layer 351c. Redistribution level 350b can include corresponding elements, features, materials, or methods of manufacturing similar to those of redistribution level 150d shown in FIGS. 3O-3Q.

In this example, trace 355ca provided on the upper surface of dielectric layer 351c can be defined as internal terminal 357a of substrate 35. Trace 355ca can be coupled to via 453b or trace 452b of redistribution level 350b through via 355cb. In some examples, after a seed is provided to cover the apertures and the upper surface of dielectric layer 351c, conductor 355c can be provided on the seed.

FIG. 7M shows a cross-sectional view of electronic device 30 at a later stage of manufacture. In the example shown in FIG. 7M, electronic component 11 can be coupled to internal terminal 357a of substrate 35. In some examples, electronic component 11 can include component terminal 111 or component interconnect 112. Electronic component 11 can include corresponding elements, features, materials, or methods of manufacturing similar to electronic component 11 of electronic devices 10 shown in FIG. 3R.

In some examples, interface material 33 can be positioned between electronic component 11 and substrate 35. Interface material 33 can comprise or be referred to as an underfill, a dielectric layer, or a non-conductive paste, and can be an organic-filler-free resin. In some examples, interface material 33 can comprise or be referred to as CUF, NCP, NCF, ACF, or ACP. In some examples, when electronic device 30 comprises molded underfill (MUF), interface material 33 can be considered part of encapsulant 12.

In some examples, after electronic component 11 is coupled to substrate 35, interface material 33 can be inserted into a gap between electronic component 11 and substrate 35 and then cured. In some examples, after interface material 33 is dispensed to cover substrate inward terminal 357a of substrate 35, component terminal 111 and component interconnect 112 of electronic component 11 penetrate through interface material 33 and can be coupled to inward terminal 357a of substrate 35. Interface material 33 can prevent electronic component 11 from being separated from substrate 35 against physical impact or chemical impact. Although electronic component 11 is shown coupled to internal terminals 357a in a face-down or in a flip-chip configuration, there can be examples where electronic component 11 can be coupled to internal terminals 357a face-up or in a wire-bond configuration. In some examples, conductor 355a or conductor 355b of conductive structure 355 can be coupled with electronic component 355.

FIGS. 7N and 7N-A show cross-sectional views of electronic device 30 at later stages of manufacture. In the example shown in FIGS. 7N and 7N-A, encapsulant 12 can be provided to cover electronic component 11 and substrate 35. In some examples, encapsulant 12 can be in contact with substrate upper side of substrate 120, and lateral or upper sides of electronic component 11. Encapsulant 12 can include corresponding elements, features, materials, or methods of manufacturing similar to encapsulant 12 of electronic devices 10 shown in FIG. 3S.

In some example shown in FIG. 7N-A, the upper side of electronic component 11 can be exposed from encapsulant 12. Encapsulant 12 can be provided to cover the upper side of substrate 35 and optionally the lateral side or sides of substrate 35, and the upper and lateral sides of electronic component 11. In some examples, the upper portion of encapsulant 12 can then be removed, such as by grinding, to expose upper side of electronic component 11. With the upper side of electronic component 11 exposed, heat dissipation of electronic component 11 can be facilitated, and the sizes of electronic device 100 can be reduced. In some examples encapsulant 12 can be thinned by a conventional grinding, or chemical etching process.

After encapsulant 12 is formed, carrier 160 can be separated from lower side of substrate 35. The lower side of substrate 35 can be exposed. A lower side of via 453a can also be exposed. In some examples, carrier 160 can be removed after encapsulant 12 is formed and before the upper portion of encapsulant 12 is removed.

FIG. 7O show a cross-sectional view of electronic device 30 at a later stage of manufacture. In the example shown in FIG. 7O, redistribution level 350d can be provided below redistribution level 350a of substrate 35. Redistribution level 350d can comprise conductor 355d and dielectric layers 351d and 351e. Redistribution level 350d can be provided while electronic device 30 is flipped and substrate 35 is positioned above encapsulant 12. In redistribution level 350d, dielectric layer 351d can provided to uniformly cover a lower portion of redistribution level 350a, and apertures exposing one or more vias 453a can be provided. Conductors 355d can comprise traces 355da extending along the lower surface of dielectric layer 351d and vias 355db filling the aperture of dielectric layer 351d. Dielectric layer 351d and conductor 355d of redistribution level 350d can include corresponding elements, features, materials, or methods of manufacturing similar to those of redistribution level 150e shown in FIGS. 3-3W.

In this example, portions of conductors 355d can define external terminals 357b of substrate 35. External terminals 357b coupled to via 453a of redistribution level 350a through via 355db. Conductor 355d can be provided on a seed covering dielectric layer 351d. After dielectric layer 351e is provided to cover dielectric layer 351d and external terminal 357b, an aperture for exposing external terminal 357b can be provided. Dielectric layer 351e can be referred to as or comprise a dielectric, a solder mask, or a solder resist. Dielectric layer 351e can include corresponding elements, features, materials, or methods of manufacturing similar to those of dielectric 151f shown in FIG. 3W.

Completed substrate 35 can comprise dielectric structure 351 and conductive structure 355. Substrate 35 has been described with dielectric structure 351 comprising dielectric layers 351a, 351b, 351c, 351d, and 351e, and with conductive structure 355 comprising conductors 355a, 355b, 355c, and 355d. The numbers of dielectric layers and conductors, however, can be less or more than those stated. In some examples, substrate 35 can comprise or be referred to as an RDL substrate, a buildup substrate, or a coreless substrate.

FIG. 7P show a cross-sectional view of electronic device 30 at a later stage of manufacture. In the example shown in FIG. 7P, connectors 17 can be coupled to external terminal 357b of substrate 35. Elements, features, materials, or methods of manufacture for connectors 17 can be similar to those described with respect to connectors 17 in FIG. 3X. In some examples, connectors 17 can be referred to as an external input/output terminal of electronic device 30.

The present disclosure includes reference to certain examples. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
a substrate having a top side and a bottom side;
an electronic component over the top side of the substrate; and
an encapsulant over the top side of the substrate and contacting a lateral side of the electronic component;
wherein the substrate comprises:
a dielectric structure comprising a first dielectric layer; and
a conductive structure in the dielectric structure and comprising a first conductor tier in the first dielectric layer;
wherein the first conductor tier comprises:
a first trace exposed from a top side of the first dielectric layer and partially extending through the first dielectric layer; and
a first via exposed from the top side of the first dielectric layer and a bottom side of the first dielectric layer and extending from the top side of the first dielectric layer to the bottom side of the first dielectric layer;
wherein the conductive structure is coupled with the electronic component; and
wherein the first trace and the first via have non-stepped sidewalls extending vertically.

2. The electronic device of claim 1, wherein:
the first trace has a width that is about 10 micrometers to about 100 micrometers.

3. The electronic device of claim 1, wherein:
the first conductor tier comprises second traces exposed from the top side of the first dielectric layer and partially extending through the first dielectric layer;

the second traces have individual widths that are about 0.005 micrometers to about 10 micrometers; and
the second traces are spaced apart at a pitch of about 0.02 micrometers to about 40 micrometers.

4. The electronic device of claim 3, wherein:
the first trace has a width that is about 10 micrometers to about 100 micrometers.

5. The electronic device of claim 1, wherein:
a full height of the first trace is a continuous monolithic trace portion of a single layer of conductive material; and
a full height of the first via is a continuous monolithic via portion of the single layer of conductive material.

6. The electronic device of claim 1, wherein:
the first conductor tier comprises second traces exposed from the top side of the first dielectric layer and partially extending through the first dielectric layer;
the first trace comprises a wide trace and the second traces comprise fine traces; and
the wide trace has a width that is greater than individual widths of the fine traces.

7. The electronic device of claim 1, wherein:
the first trace has a base with an arcuate vertex that is convex toward the bottom side of the first dielectric layer.

8. The electronic device of claim 1, wherein:
the encapsulant covers a top side of the electronic component.

9. The electronic device of claim 1, wherein:
the dielectric structure comprises a second dielectric layer over the first dielectric layer; and
the conductive structure comprises a second conductor tier in the second dielectric layer;
wherein the second conductor tier comprises:
a second trace exposed from a top side of the second dielectric layer and partially extending through the second dielectric layer; and
a second via exposed from the top side of the second dielectric layer and a bottom side of the second dielectric layer and extending from the top side of the second dielectric layer to the bottom side of the second dielectric layer;
and
wherein the second conductor tier is coupled with the first conductor tier.

10. The electronic device of claim 9, wherein:
the first conductor tier is coupled with the electronic device via the second conductor tier.

11. A method to manufacture an electronic device, comprising:
providing a substrate having a top side and a bottom side;
providing an electronic component over the top side of the substrate; and
providing an encapsulant over the top side of the substrate and contacting a lateral side of the electronic component;
wherein providing the substrate comprises:
providing a dielectric structure comprising a first dielectric layer; and
providing a conductive structure in the dielectric structure;
wherein the conductive structure comprises a first conductor tier in the first dielectric layer, and the first conductor tier comprises:
a first trace exposed from a top side of the first dielectric layer and partially extending through the first dielectric layer; and a first via exposed from the top side of the first dielectric layer and a bottom side of the first dielectric layer and extending from the top side of the first dielectric layer to the bottom side of the first dielectric layer; 5 and wherein the first trace and the first via have non-stepped sidewalls extending vertically.

12. The method of claim 11, wherein:

the first conductor tier comprises second traces in the first 10 dielectric layer;

wherein the second traces are exposed from the top side of the first dielectric layer and partially extend through the first dielectric layer.

13. The method of claim 12, wherein: 15 the first trace comprises a wide trace and the second traces comprise narrow traces; and the wide trace has a width that is greater than individual widths of the narrow traces.

* * * * * 20